(12) United States Patent
Fujikata et al.

(10) Patent No.: US 11,447,885 B2
(45) Date of Patent: Sep. 20, 2022

(54) PLATING METHOD AND PLATING APPARATUS

(71) Applicant: EBARA CORPORATION, Tokyo (JP)

(72) Inventors: Jumpei Fujikata, Tokyo (JP); Masashi Shimoyama, Tokyo (JP); Ryu Miyamoto, Tokyo (JP); Kentaro Ishimoto, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 24 days.

(21) Appl. No.: 17/095,138

(22) Filed: Nov. 11, 2020

(65) Prior Publication Data

US 2021/0062354 A1    Mar. 4, 2021

Related U.S. Application Data

(63) Continuation of application No. 15/937,353, filed on Mar. 27, 2018, now Pat. No. 10,865,492.

(30) Foreign Application Priority Data

Mar. 31, 2017  (JP) .............................. JP2017-071160

(51) Int. Cl.
| | | |
|---|---|---|
| *C25D 17/00* | (2006.01) | |
| *C25D 5/34* | (2006.01) | |
| *H01L 21/768* | (2006.01) | |
| *C23C 18/54* | (2006.01) | |
| *C25D 7/12* | (2006.01) | |
| *C25D 3/02* | (2006.01) | |
| *C25D 5/02* | (2006.01) | |
| *H01L 21/67* | (2006.01) | |

(52) U.S. Cl.
CPC .............. *C25D 5/34* (2013.01); *C23C 18/54* (2013.01); *C25D 3/02* (2013.01); *C25D 5/022* (2013.01); *C25D 7/12* (2013.01); *C25D 7/123* (2013.01); *C25D 17/001* (2013.01); *H01L 21/6723* (2013.01); *H01L 21/76873* (2013.01)

(58) Field of Classification Search
None
See application file for complete search history.

(56) References Cited

U.S. PATENT DOCUMENTS

| | | |
|---|---|---|
| 6,551,487 B1 | 4/2003 | Reid et al. |
| 2002/0027080 A1 | 3/2002 | Yoshioka et al. |
| 2003/0134498 A1 | 7/2003 | Chen et al. |

(Continued)

FOREIGN PATENT DOCUMENTS

| | | | | |
|---|---|---|---|---|
| EP | 0411599 | * | 2/1999 | ............. C25D 21/08 |
| JP | H06-151397 A | | 5/1994 | |

(Continued)

*Primary Examiner* — Stefanie S Wittenberg
(74) *Attorney, Agent, or Firm* — BakerHostetler

(57) ABSTRACT

A plating method for plating a substrate having resist opening portions is provided. The plating method includes a resist residue removing step of removing resist residues in the resist opening portions of the substrate by spraying first process liquid to a surface of the substrate on which the resist opening portions are formed, a liquid filling step of soaking the substrate passed through the removing step in second process liquid to fill the resist opening portions of the substrate with the second process liquid, and a plating step of plating the substrate passed through the liquid filling step.

12 Claims, 13 Drawing Sheets

(56) References Cited

U.S. PATENT DOCUMENTS

| | | | |
|---|---|---|---|
| 2005/0082163 | A1 | 4/2005 | Yoshioka et al. |
| 2006/0141157 | A1 | 6/2006 | Sekimoto et al. |
| 2010/0126849 | A1* | 5/2010 | Lopatin .................... C25D 5/08 |
| | | | 204/275.1 |
| 2010/0320081 | A1 | 12/2010 | Mayer et al. |
| 2012/0255864 | A1 | 10/2012 | Nagai et al. |
| 2013/0220383 | A1* | 8/2013 | Fujikata ............ H01L 21/67057 |
| | | | 134/36 |
| 2014/0230860 | A1 | 8/2014 | Chua et al. |
| 2017/0243839 | A1 | 8/2017 | Buckalew et al. |

FOREIGN PATENT DOCUMENTS

| | | | | |
|---|---|---|---|---|
| JP | 2000-003942 | A | | 1/2000 |
| JP | 2004-269923 | A | | 9/2004 |
| JP | 2004-353004 | A | | 12/2004 |
| JP | 2005-244130 | A | | 9/2005 |
| JP | 2012-224944 | A | | 11/2012 |
| KR | 20040017698 | A | | 2/2004 |
| KR | 20120058717 | | * | 6/2012 ........... C25D 17/001 |
| WO | WO 2001/068952 | A1 | | 9/2001 |

* cited by examiner

PLATING METHOD AND PLATING APPARATUS

CROSS-REFERENCE TO RELATED APPLICATION

This application is a continuation application of U.S. patent application Ser. No. 15/937,353, filed Mar. 27, 2018 which is based upon and claims benefit of priority from Japanese Patent Application No. 2017-071160 filed on Mar. 31, 2017, the entire contents of which are incorporated herein by reference.

TECHNICAL FIELD

The present invention relates to a plating method and a plating apparatus.

BACKGROUND ART

It has been hither general that wires are formed in minute wiring trenches, holes or resist opening portions which are provided on the surface of a semiconductor wafer or the like, and bumps (protruded electrodes) to be electrically connected to electrodes of a package are formed on the surface of a semiconductor wafer or the like. For example, an electroplating method, a deposition method, a printing method, a ball bump method, etc. are known as the method of forming wires and bumps as described above. In connection with increase in the number of I/Os of a semiconductor chip and a trend to smaller pitches, the electroplating method that enables microfabrication and is relatively stable in performance has been frequently used.

In the electroplating method, if a bubble remains in a resist opening portion, the bubble portion is not plated, and plating failure may occur. Particularly, a bubble is liable to remain at a resist opening portion having a high aspect ratio such as a bump or the like. Therefore, in order to avoid plating failure, it is necessary to introduce plating solution so that no bubble remains in the resist opening portion.

In order to prevent a bubble from remaining in a resist opening portion, so-called pre-wetting treatment, which is a hydrophilization treatment for a substrate, has been hitherto executed before plating (for example, see PTL 1). Specifically, in the pre-wetting treatment, the substrate is soaked in deaerated water or the like to fill the resist opening portion with water. When the substrate with the resist opening portion filled with water is soaked in plating solution, the water in the resist opening portion is replaced by the plating solution, and then the resist opening portions is filled with the plating solution.

CITATION LIST

Patent Literature

PTL 1: JP2012-224944A

SUMMARY OF INVENTION

Technical Problem

A resist is coated on a plating target substrate in a step before plating processing to form a resist opening portion. At this time, a resist residue may exist at the bottom portion of the resist opening portion. In this case, even when the resist opening portion can be filled with the liquid by soaking the substrate in deaerated water or the like as described above, plating failure may occur because the portion where the resist residue exists is not filled with the liquid. Therefore, in order to prevent the plating failure, it is necessary to not only remove the bubble in the resist opening portion, but also remove the resist residue.

The present invention has been implemented in view of the foregoing problem, and has an object to suppress occurrence of plating failure which is caused by the bubble and the resist residue existing in the resist opening portion.

Solution to Problem

According to an aspect of the present invention, a plating method for plating a substrate having resist opening portions is provided. The plating method includes a resist residue removing step of removing resist residues in the resist opening portions of the substrate by spraying first process liquid to a surface of the substrate on which the resist opening portions are formed, a liquid filling step of soaking the substrate passed through the removing step in second process liquid to fill the resist opening portions of the substrate with the second process liquid, and a plating step of plating the substrate passed through the liquid filling step.

According to another aspect of the present invention, a plating apparatus for plating a substrate having resist opening portions is provided. The plating apparatus includes a resist residue removing apparatus for removing resist residues in resist opening portions of the substrate, comprising a spray unit having nozzles for spraying first process liquid to a surface of the substrate on which the resist opening portions are formed, a liquid filling apparatus for soaking the substrate in second process liquid to fill the resist opening portions of the substrate with the second process liquid, and a plating bath for plating the substrate.

DESCRIPTION OF EMBODIMENTS

Figure 1:
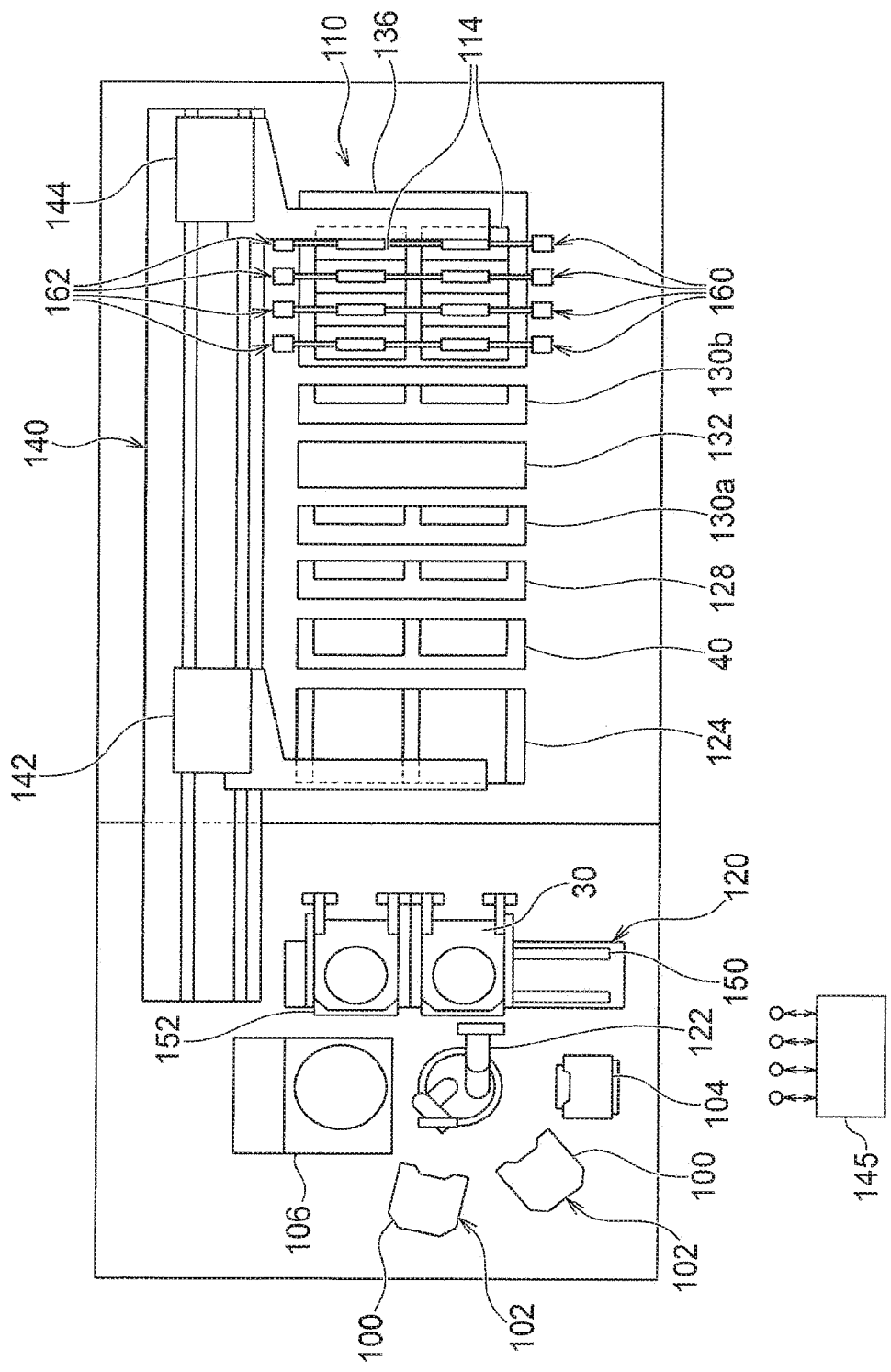
FIG. 1 is a general arrangement diagram of a plating apparatus according to an embodiment.

Embodiments according to the present invention will be described hereunder with reference to the drawings. In the drawings described below, the same or corresponding constituent elements are represented by the same reference signs, and duplicative descriptions thereof are omitted. FIG. 1 is a general arrangement diagram of a plating apparatus according to an embodiment. As shown in FIG. 1, the plating apparatus includes two cassette tables 102, an aligner 104 for aligning the position of OF (orientation flat), a notch or the like of the substrate in a predetermined direction, and a spin rinse dryer 106 for drying the plating-processed substrate by rotating the substrate at a high speed. The cassette table 102 serves to mount thereon a cassette 100 in which a substrate such as a semiconductor wafer or the like is accommodated. A substrate mounting/demounting unit 120 which has substrate holders 30 installed thereon to mount/demount a substrate is provided in the vicinity of the spin rinse dryer 106. A substrate transporting device 122 comprising a transporting robot for transporting a substrate among the above units 100, 104, 106 and 120 is arranged at the center of these units 100, 104, 106 and 120.

The substrate mounting/demounting unit 120 has a flat plate type mounting plate 152 which is freely slidable along rails 150 in a lateral direction. The two substrate holders 30 are mounted horizontally side by side on the mounting plate 152, and a substrate is delivered between one of the substrate holders 30 and the substrate transporting device 122. Thereafter, the mounting plate 152 is slid in the lateral direction, and the substrate is delivered between the other substrate holder 30 and the substrate transporting device 122.

The plating apparatus further includes a stocker 124, a pre-wetting bath 40, a pre-soaking bath 128, a first cleaning bath 130a, a blowing bath 132, a second cleaning bath 130b, and a plating bath 110. In the stocker 124, preservation and temporary placement of the substrate holders 30 are performed. In the pre-wetting bath 40, the substrate is subjected to a hydrophilization treatment. In the pre-soaking bath 128, an oxide film on the surface of a conductive layer such as a seed layer or the like formed on the surface of the substrate is removed by etching. In the first cleaning bath 130a, the pre-soaked substrate is cleaned with cleaning solution (pure water or the like) together with the substrate holder 30. In the blowing bath 132, draining is performed on the cleaned substrate. In the second cleaning bath 130b, the plated substrate is cleaned with cleaning solution together with the substrate holder 30. The substrate mounting/demounting unit 120, the stocker 124, the pre-wetting bath 40, the pre-soaking bath 128, the first cleaning bath 130a, the blowing bath 132, the second cleaning bath 130b and the plating bath 110 are successively arranged in this order.

The plating bath 110 is configured, for example, by accommodating plural plating cells 114 in an overflow bath 136. Each plating cell 114 is configured so as to accommodate one substrate therein and soak the substrate in plating solution stocked therein to perform plating such as copper plating on the surface of the substrate.

The plating apparatus includes a substrate holder transporting device 140 which is located on the side of each of the above units, adopts, for example, a linear motor system, and transports the substrate holders 30 together with the substrate among the above units. The substrate holder transporting device 140 includes a first transporter 142, and a second transporter 144. The first transporter 142 is configured so as to transport the substrate among the substrate mounting/demounting unit 120, the stocker 124, the pre-wetting bath 40, the pre-soaking bath 128, the first cleaning bath 130a, and the blowing bath 132. The second transporter 144 is configured so as to transport the substrate among the first cleaning bath 130a, the second cleaning bath 130b, the blowing bath 132 and the plating bath 110. The plating apparatus may be configured to have no second transporter 144, but have only the first transporter 142.

On both the sides of the overflow bath 136 are arranged paddle driving units 160 and paddle driven units 162 for driving paddles serving as stirring rods each of which is located in each plating cell 114 to stir plating solution in the plating cell 114.

The plating apparatus includes a controller 145 configured to control the operation of each unit of the above-described plating apparatus. The controller 145 includes, for example, a computer-readable recording medium for storing a predetermined program for causing the plating apparatus to execute a plating process, CPU (Central Processing Unit) for executing the program of the recording medium, etc. The controller 145 can perform, for example, resist residue removing processing and liquid filling processing described later in the pre-wetting bath 40, mounting/demounting operation control of the substrate mounting/demounting unit 120, transportation control of the substrate transporting device 122, transportation control of the substrate holder transporting device 140, control of plating current and plating time in the plating bath 110, etc. A magnetic medium such as a flexible disc, a hard disc, or a memory storage, an optical medium such as CD or DVD, a magnetooptic medium such as MO or MD, or any recording means may be adopted as the recording medium equipped in the controller 145.

An example of a series of plating processing of the plating apparatus will be described. First, one substrate is taken out from the cassette 100 mounted on the cassette table 102 by the substrate transporting device 122, and transports the substrate to the aligner 104. The aligner 104 aligns the position of an orientation flat, a notch or the like in a predetermined direction. The substrate which has been aligned in the direction by the aligner 104 is transported to the substrate mounting/demounting unit 120 by the substrate transporting device 122.

In the substrate mounting/demounting unit 120, two substrate holders 30 accommodated in the stocker 124 are simultaneously grasped and transported to the substrate mounting/demounting unit 120 by the first transporter 142 of the substrate holder transporting device 140. Then, the first transporter 142 simultaneously places the two substrate holders 30 horizontally on the mounting plate 152 of the substrate mounting/demounting unit 120. Under this state, the substrate transporting device 122 transports a substrate to each substrate holder 30, and the transported substrate is held by the substrate holder 30.

Next, the two substrate holders 30 which hold the respective substrates are simultaneously grasped and transported to the pre-wetting bath 40 by the first transporter 142 of the substrate holder transporting device 140. Next, the substrate holders 30 holding the substrates which have been processed in the pre-wetting bath 40 are transported to the pre-soaking bath 128 by the first transporter 142, and an oxide film on each substrate is etched in the pre-soaking bath 128. Subsequently, the substrate holders 30 holding the substrates are transported to the first cleaning bath 130a to wash the surfaces of the substrates with pure water stocked in the first cleaning bath 130a.

The substrate holders 30 holding the substrates for which the water-washing has been completed are transported from the first cleaning bath 130a to the plating bath 110 by the second transporter 144, and accommodated in the respective plating cells 114 filled with plating solution. The second transporter 144 successively repeats the foregoing procedure to successively accommodate each substrate holder 30 holding a substrate in each plating cell 114 of the plating bath 110.

In each plating cell 114, a plating voltage is applied between an anode (not shown) in the plating cell 114 and a substrate Wf, and at the same time, the paddle is reciprocally moved in parallel to the surface of the substrate by the paddle driving unit 160 and the paddle driven unit 162, thereby plating the surface of the substrate.

After the plating is finished, the two substrate holders 30 holding respective plated substrates are simultaneously grasped and transported to the second cleaning bath 130b by the second transporter 144, and soaked in pure water stocked in the second cleaning bath 130b to wash the surfaces of the substrates with pure water. Next, the substrate holders 30 are transported to the blowing bath 132 by the second transporter 144 to remove water droplets attached to the substrate holders 30 by spraying air or the like. Thereafter, the substrate holders 30 are transported to the substrate mounting/demounting unit 120 by the first transporter 142.

In the substrate mounting/demounting unit 120, the processed substrate is taken out from the substrate holder 30 and transported to the spin rinse dryer 106 by the substrate transporting device 122. The spin rinse dryer 106 rotates the processed substrate at high speed to dry the substrate. The dried substrate is returned to the cassette 100 by the substrate transporting device 122.

Figure 2:
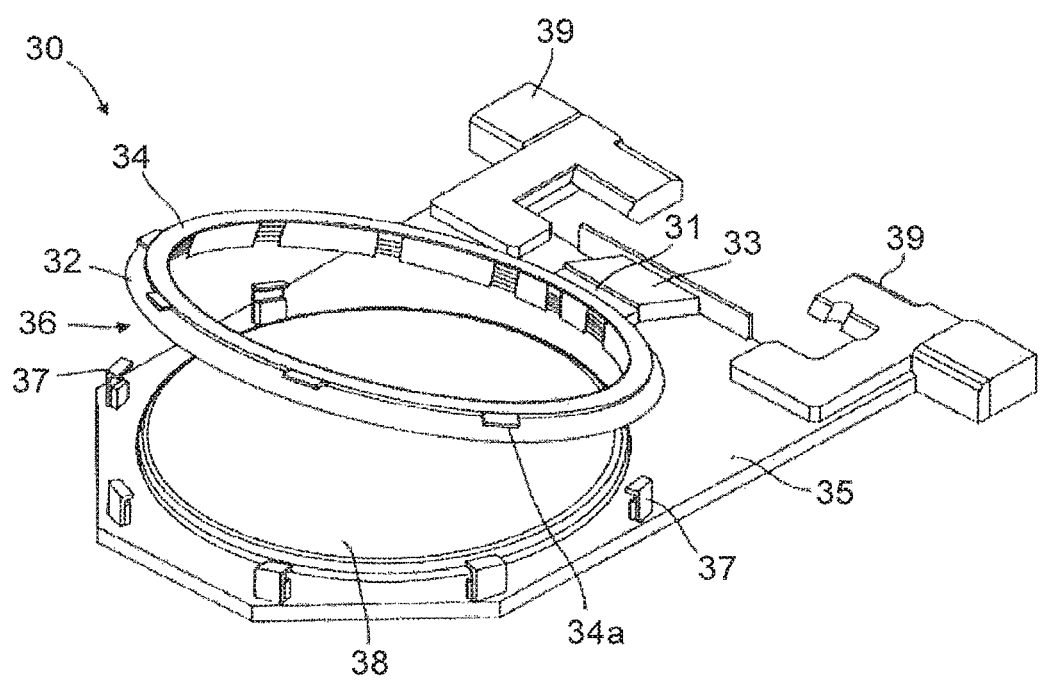
FIG. 2 is a perspective view showing a substrate holder shown in FIG. 1.

Next, the substrate holder 30 shown in FIG. 1 will be described in detail. FIG. 2 is a perspective view showing the substrate holder 30 shown in FIG. 1. As shown in FIG. 2, the substrate holder 30 includes, for example, a rectangular flat-plate type first holding member 35 formed of vinyl chloride, and a second holding member 36 which is fitted to the first holding member 35 via a hinge 33 so as to be freely opened and closed. A holding face 38 for holding the substrate is provided substantially at the center portion of the first holding member 35 of the substrate holder 30. Inverted L-shaped dampers 37 having protrusions protruding inwards are provided at equal intervals along the circumference of the holding face 38 on the outer periphery of the holding face 38 of the first holding member 35.

A pair of substantially T-shaped hands 39 serving as support portions when the substrate holder 30 is transported or suspended are linked to an end portion of the first holding member 35 of the substrate holder 30. In the stocker 124 shown in FIG. 1, the substrate holder 30 is vertically suspended and supported by hooking the hands 39 to the upper surface of the peripheral wall of the stocker 124. Furthermore, the hands 39 of the suspended substrate holder 30 are grasped by the first transporter 142 or the second transporter 144 to transport the substrate holder 30. In the pre-wetting bath 40, the pre-soaking bath 128, the first cleaning bath 130a, the second cleaning bath 130b, the blowing bath 132 and the plating bath 110, the substrate holder 30 is also suspended on the peripheral wall of each bath via the hands 39.

An external contact (not shown) for connecting to an external power source is provided to the hand 39. The external contact is electrically connected to plural relay contacts (not shown) provided to the outer periphery of the holding face 38 via plural wires.

The second holding member 36 includes a base portion 31 fixed to the hinge 33, and a ring-shaped seal holder 32 fixed to the base portion 31. A press ring 34 for pressing the seal holder 32 against the first holding member 35 to fix the seal holder 32 to the first holding member 35 is freely rotatably mounted on the seal holder 32 of the second holding member 36. The press ring 34 has plural protruding portions 34a protruding outwards at the outer peripheral portion of the press ring 34. The upper surface of the protruding portion 34a and the lower surface of the inwardly protruding portion of the dampers 37 have tapered faces which are respectively inclined in opposite directions along the rotational direction.

When the substrate is held, the substrate is first placed on the holding face 38 of the first holding member 35 while the second holding member 36 is opened, and then the second holding member 36 is closed to pinch the substrate by the first holding member 35 and the second holding member 36. Subsequently, the press ring 34 is clockwise rotated so that the protruding portions 34a of the press ring 34 are slip into the insides (the lower sides) of the inwardly protruding portions of the dampers 37. As a result, the first holding member 35 and the second holding member 36 are fastened and locked to each other via the tapered faces provided to the press ring 34 and the dampers 37, respectively, thereby holding the substrate. The plating target surface of the held substrate is exposed to the outside. When the holding of the substrate is released, the press ring 34 is counterclockwise rotated while the first holding member 35 and the second holding member 36 are kept locked to each other, whereby the protruding portions 34a of the press ring 34 are detached from the inverted L-shaped dampers 37, and the holding of the substrate is released.

Next, the pre-wetting bath 40 shown in FIG. 1 will be described in detail. When a substrate having resist opening portions is plated as described above, it is necessary to fill the resist opening portions with liquid. In addition, when resist residues exists in the resist opening portions, it is also necessary to remove the resist residues. Therefore, the pre-wetting bath 40 of this embodiment includes a resist residue removing apparatus for removing the resist residues in the resist opening portions and a liquid filling apparatus for filling the resist opening portions with liquid.

Figure 3:
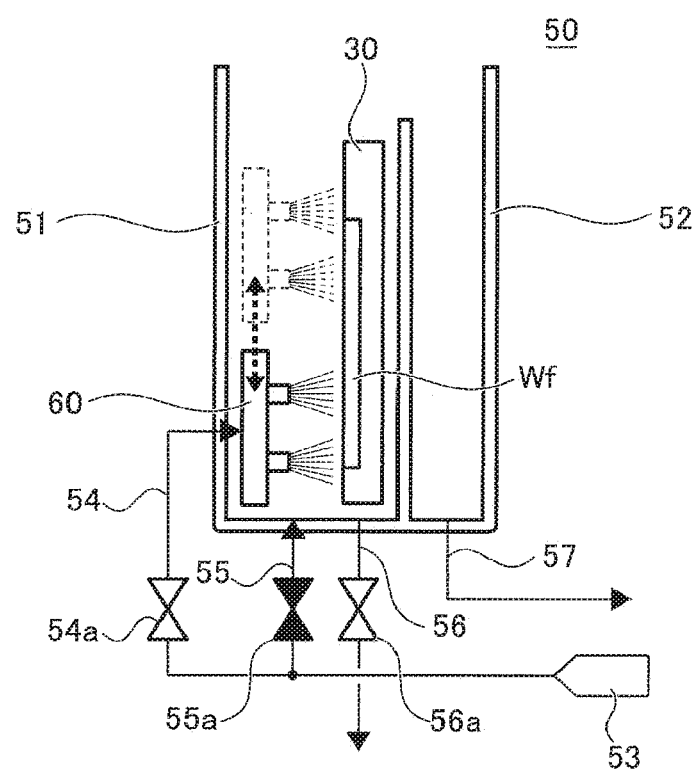
FIG. 3 is a schematic side cross-sectional view of a resist residue removing apparatus.

FIG. 3 is a schematic side cross-sectional view of the resist residue removing apparatus. As shown in FIG. 3, the resist residue removing apparatus 50 includes a processing bath 51 (corresponding to an example of a first processing bath), an overflow bath 52, and a spray unit 60. The processing bath 51 is configured so that the substrate holder 30 holding a substrate Wf is vertically accommodated in the processing bath 51. The spray unit 60 is arranged in the processing bath 51 and includes nozzles which are arranged so as to confront the substrate holder 30, and spray first process liquid to a surface of the substrate Wf on which resist opening portions are formed (plating target surface). The overflow bath 52 is arranged to be adjacent to the processing bath 51, and configured to receive the first process liquid overflowing from the processing bath 51. As the first process liquid to be sprayed onto the substrate Wf by the spray unit 60 may be adopted, for example, any one of pure water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, and any combination thereof. In this embodiment, an example in which pure water is used as the first process liquid will be described.

The resist residue removing apparatus 50 further includes a first supply pipe 54 which is in fluid communication with the spray unit 60, a second supply pipe 55 which is in fluid communication with the processing bath 51, a first discharge pipe 56 which is in fluid communication with the processing bath 51, and a second discharge pipe 57 which is in fluid communication with the overflow bath 52. The first supply pipe 54 and the second supply pipe 55 are in fluid communication with a pure water supply source 53. The first supply pipe 54 is provided with a first supply valve 54a for opening/closing the first supply pipe 54. The second supply pipe 55 is provided with a second supply valve 55a for opening/closing the second supply pipe 55. The first discharge pipe 56 is provided with a first discharge valve 56a for opening/closing the first discharge pipe 56.

The first supply pipe 54 is configured so as to supply pure water from the pure water supply source 53 to the spray unit 60 when the spray unit 60 sprays pure water to the substrate Wf. The second supply pipe 55 is configured to supply liquid such as pure water or the like to the processing bath 51, which makes it possible to soak the substrate Wf in the liquid. The first discharge pipe 56 is configured to discharge pure water sprayed from the spray unit 60 to the substrate Wf. The second discharge pipe 57 is configured to discharge pure water received by the overflow bath 52.

The pure water sprayed from the spray unit 60 to the substrate Wf infiltrates into the resist opening portions, and is capable of removing resist residues in the resist opening portions. The resist residue removing apparatus 50 has a moving mechanism (not shown) such as an actuator or the like which relatively moves the spray unit 60 along the surface of the substrate Wf in the vertical direction. The resist residue removing apparatus 50 reciprocally moves the spray unit 60 in the vertical direction to scan the substrate Wf with the nozzles of the spray unit 60. At this time, it is preferable that the spray unit 60 sprays pure water to all the resist opening portions of the substrate Wf. In other words, it is preferable that pure water from the spray unit 60 is made to impinge against the whole face of the surface of the substrate Wf on which the resist opening portions are formed. As a result, the resist residues in the resist opening portions can be removed over the whole face of the plating target surface of the substrate Wf. In this specification, "the whole face of the surface of the substrate Wf on which the resist opening portions are formed" means the whole face of a surface of the substrate Wf which is exposed from the substrate holder 30.

The pure water from the spray unit 60 is stagnant in the resist opening portions, so that the resist opening portions can be filled with pure water to some extent. On the other hand, when the pressure of pure water from the spray unit 60 is increased so as to remove the resist residues in the resist opening portions, lots of bubbles are caught in the resist opening portions. However, these bubbles can be removed by the liquid filling apparatus described later. The pure water from the spray unit 60 is preferably sprayed at a pressure ranging from not less than 0.05 MPa to not more than 0.45 MPa. As a result, the resist residues in the resist opening portions can be surely removed. When the pure water is sprayed at a pressure less than 0.05 MPa, the pressure of the pure water is weak, and thus the resist residues may not be removed at some places. Furthermore, when the pure water is sprayed at a pressure exceeding 0.45 MPa, more bubbles are caught in the resist opening portions, so that the processing time in the liquid filling apparatus described later becomes longer.

Furthermore, it is preferable that the pure water from the spray unit 60 can be sprayed at a flow speed ranging from not less than 2.5 m/sec to not more than 15.0 m/sec and a flow rate ranging from not less than 10 L/min to not more than 20 L/min. By setting the flow speed of the pure water within the foregoing range, the amount of bubbles to be caught in the resist opening portions can be reduced, and the processing time in the liquid filling apparatus described later can be shortened. Furthermore, by setting the flow rate of the pure water within the foregoing range, resist residues can be efficiently removed. Accordingly, by setting the flow speed and the flow rate of the pure water within the foregoing ranges, both the processing time in the resist residue removing apparatus 50 and the processing time in the liquid filling apparatus described later can be shortened.

In the resist residue removing apparatus 50 shown in FIG. 3, the spray unit 60 is configured to reciprocate in the vertical direction. However, the present invention is not limited to this manner, and the substrate holder 30 may be reciprocated in the vertical direction by a moving mechanism such as an actuator or the like. That is, it is sufficient for the spray unit 60 and the substrate holder 30 to move relatively to each other, whereby resist residues can be removed over the whole face by spraying pure water to the whole face of the substrate Wf. Accordingly, for example, both the spray unit 60 and the substrate holder 30 may be reciprocated in the opposite directions to each other. In this case, the scan stroke of the spray unit 60 and the movement stroke of the substrate holder 30 can be reduced. Furthermore, when there is no restriction on the installation space of the plating apparatus, the resist residue removing apparatus 50 may be configured so that the spray unit 60 and/or the substrate holder 30 are reciprocated in the horizontal direction.

In the resist residue removing apparatus 50 shown in FIG. 3, the substrate holder 30 is accommodated vertically in the processing bath 51. However, the present invention is not limited to this manner, and the substrate holder 30 may be accommodated, for example horizontally in the processing bath 51. In this case, the spray unit 60 can be also arranged so as to confront the substrate Wf. When the substrate holder 30 is arranged vertically as in the case of this embodiment, pure water sprayed to the substrate Wf flows downwards by gravitational force. Therefore, the amount of pure water stagnant on the surface of the substrate Wf can be reduced, so that the resist residue removing efficiency of the spray unit 60 can be suppressed from decreasing due to the pure water (water membrane) stagnant on the surface of the substrate Wf.

Figure 4:
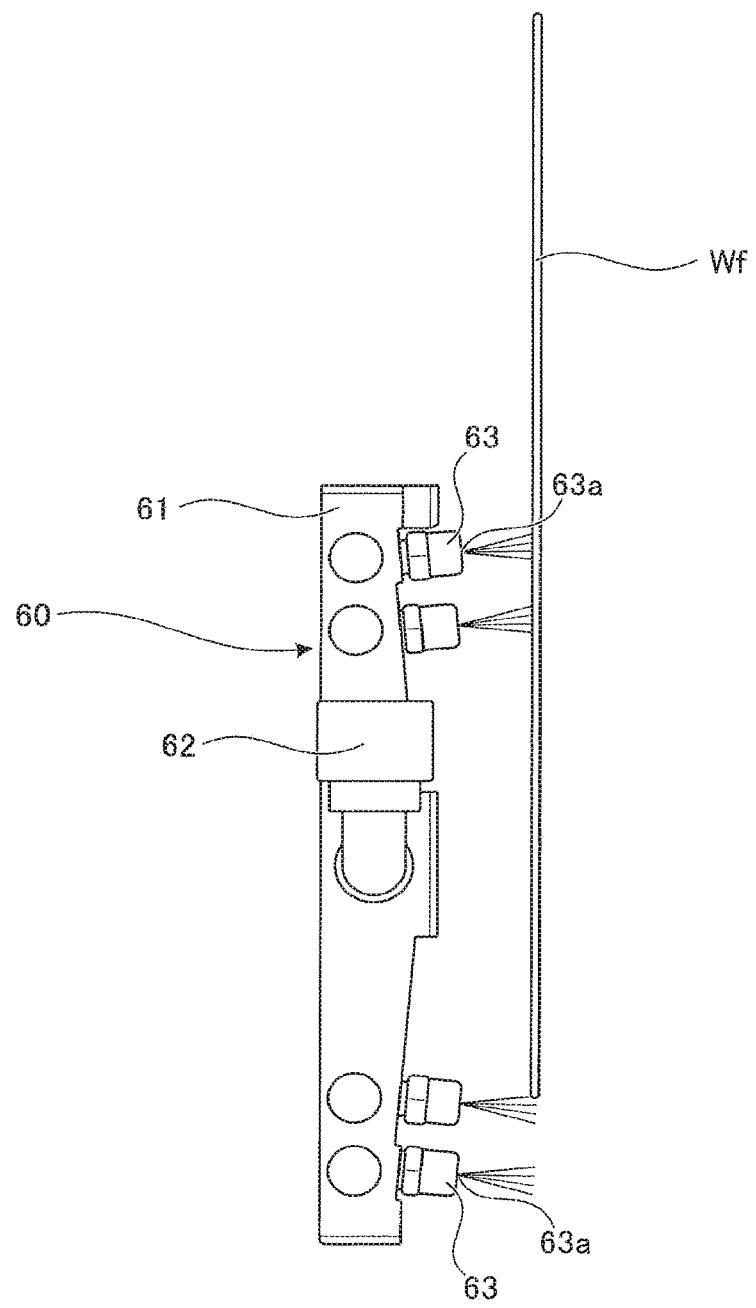
FIG. 4 is a side view of a spray unit shown in FIG. 3.
Figure 5:
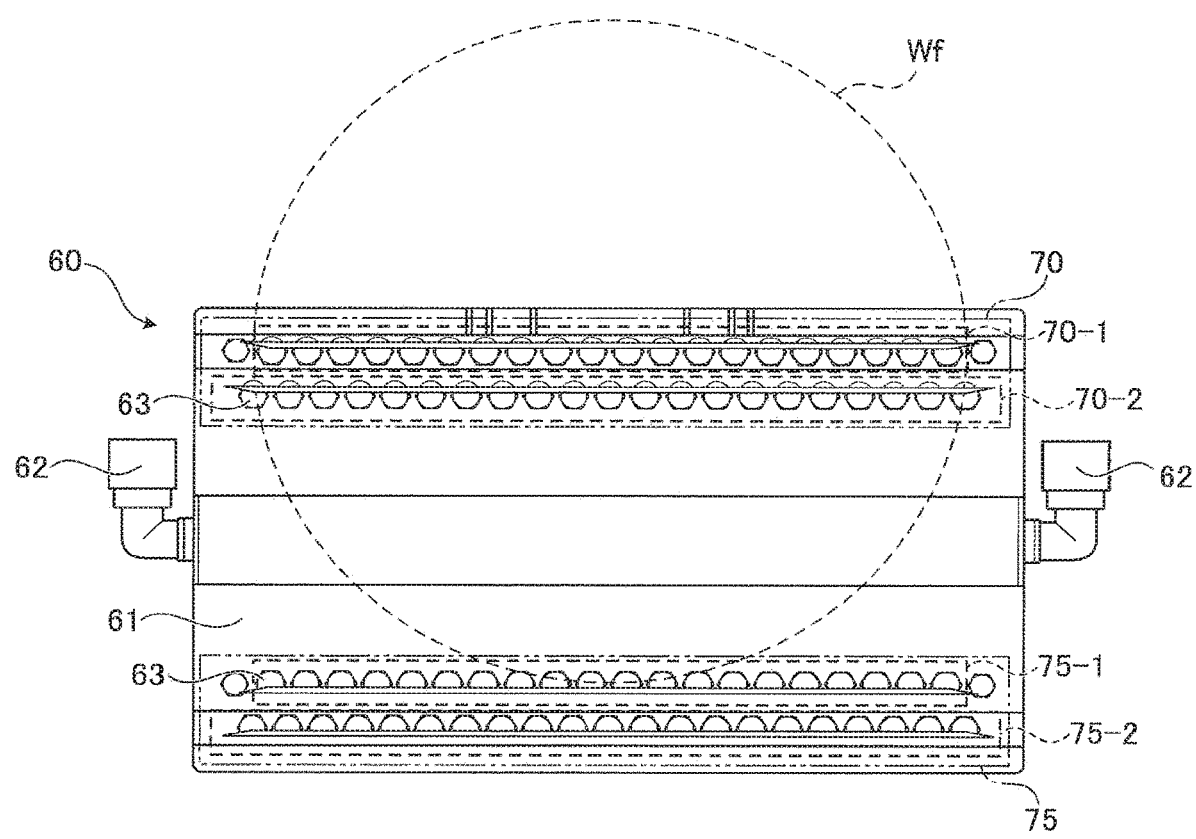
FIG. 5 is a plan view showing the spray unit shown in FIG. 3.

FIG. 4 is a side view of the spray unit 60 shown in FIG. 3. FIG. 5 is a plan view of the spray unit 60 shown in FIG. 3. In FIGS. 4 and 5, for convenience of description, the substrate Wf is shown, and also a state that pure water is sprayed from each nozzle 63 is shown. As shown in FIGS. 4 and 5, the spray unit 60 includes plural nozzles 63 for spraying pure water, a substantially plate-like main body portion 61 to which the nozzles 63 are fitted, and a pipe portion 62 for supplying pure water to the nozzles 63. In the main body portion 61 is provided a pipe (not shown) for distributing pure water from the pipe portion 62 to the respective nozzles 63.

As shown in FIG. 5, the spray unit 60 includes a first nozzle group 70 and a second nozzle group 75 which are spaced from each other in upper and lower positions in the vertical direction. The first nozzle group 70 and the second nozzle group 75 respectively have plural nozzles 63 arranged in the horizontal direction (width direction). Furthermore, the first nozzle group 70 includes a first nozzle array 70-1 and a second nozzle array 70-2 which are arranged in the horizontal direction. The first nozzle array 70-1 and the second nozzle array 70-2 are arranged to be adjacent to each other in upper and lower positions. Likewise, the second nozzle group 75 includes a first nozzle array 75-1 and a second nozzle array 75-2 which are arranged in the horizontal direction. The first nozzle array 75-1 and the second nozzle array 75-2 are arranged to be adjacent to each other in upper and lower positions.

Each of the plural nozzles 63 constituting the first nozzle group 70 and the second nozzle group 75 is capable of spraying pure water over a predetermined width. Accordingly, the first nozzle array 70-1, the second nozzle array 70-2, the first nozzle array 75-1 and the second nozzle array 75-2 are configured to be capable of spraying pure water over the whole area in the width direction (the right-and-left direction in FIG. 5) of the substrate Wf Therefore, for example even when one of the nozzles 63 of the first nozzle array 70-1 or the first nozzle array 75-1 clogs, pure water can be sprayed over the whole area in the width direction of the substrate by the nozzles 63 of the second nozzle array 70-2 or the second nozzle array 75-2 by reciprocating the spray unit 60 in the vertical direction along the surface of the substrate Wf That is, in this embodiment, since each of the first nozzle group 70 and the second nozzle group 75 has two nozzle arrays, there can be avoided such a situation that pure water is not sprayed to the substrate Wf even when a trouble occurs in a nozzle(s) 63 of any array, and the reliability of the spray unit 60 can be enhanced. In this embodiment, since the spray unit 60 includes the first nozzle group 70 and the second nozzle group 75 which are spaced from each other vertically in upper and lower positions, a stroke when the spray unit 60 is reciprocated in the vertical direction can be reduced.

In this embodiment, the first nozzle array 70-1 of the first nozzle group 70 comprises twenty nozzles 63, and the second nozzle array 70-2 of the first nozzle group 70 comprises twenty-one nozzles 63. As shown in FIG. 5, the position in the horizontal direction of each of the nozzles 63 of the first nozzle array 70-1 corresponds to the intermediate position between two adjacent nozzles 63 of the second nozzle array 70-2. That is, the nozzles 63 of the first nozzle group 70 are arranged in a staggered array. Likewise, the second nozzle array 75-1 of the second nozzle group 75 comprises twenty nozzles 63, and the second nozzle array 75-2 of the second nozzle group 75 comprises twenty-one nozzles 63. As shown in FIG. 5, the position in the horizontal direction of each of the nozzles 63 of the second nozzle array 75-1 corresponds to the intermediate position between two adjacent nozzles 63 of the second nozzle array 75-2. That is, the nozzles 63 of the second nozzle group 75 are arranged in a staggered array. The arrangement of the nozzles 63 in the staggered array as described above enables pure water to be uniformly sprayed in the width direction (the right-and-left direction in FIG. 5) of the substrate Wf.

As shown in FIG. 4, the nozzles 63 are provided to the spray unit 60 so that nozzle ports 63a thereof are inclined with respect to a direction perpendicular to the plating target surface of the substrate Wf In this embodiment, the nozzles 63 of the first nozzle group 70 are provided to the spray unit 60 so that the nozzle ports 63a thereof faces upwards at an angle of about 5° C. with respect to the horizontal plane. In addition, the nozzles 63 of the second nozzle group 75 are provided to the spray unit 60 so that the nozzle ports 63a thereof faces downwards at an angle of about 5° C. with respect to the horizontal plane. As described with reference to FIG. 2, the substrate holder 30 holds the substrate Wf by pinching the substrate Wf with the first holding member 35 and the second holding member 36. Therefore, a step exists between the press ring 34 constituting the second holding member 36 and the substrate Wf, so that a portion shadowed by the press ring 34 may exist on the plating target surface of the substrate Wf. In this embodiment, since the nozzle ports 63a are inclined with respect to the direction perpendicular to the plating target surface of the substrate Wf, so that spray can be also directly applied to the shadowed portion on the plating target surface of the substrate Wf as described above. Furthermore, the resist residues in the resist opening portions can be removed over the whole face of the substrate Wf.

In this embodiment, when spraying from the first nozzle group 70 and spraying from the second nozzle group 75 are simultaneously performed, pure water sprayed from the first nozzle group 70 onto the surface of the substrate Wf flows downwards due to gravitational force, and forms a water membrane on the surface of the substrate Wf, which causes the second nozzle group 75 to spray pure water onto the water membrane formed by the spraying from the first nozzle group 70. As a result, it is difficult to directly apply pure water to the resist opening portions of the substrate Wf, and thus the efficiency of removing resist residues by the spraying from the second nozzle group 75 may decrease. Therefore, in this embodiment, when pure water is sprayed to the substrate Wf by the spray unit 60, it is preferable that the spraying from the first nozzle group 70 and the spraying from the second nozzle group 75 are performed at different timings, so that the influence of the water membrane under the spraying from each of the nozzle groups can be reduced.

Particularly, in this embodiment, the nozzles 63 of the first nozzle group 70 are placed face up with respect to the horizontal plane, and the nozzles 63 of the second nozzle group 75 are placed face down with respect to the horizontal plane as shown in FIG. 4. Accordingly, it is preferable that pure water is sprayed from the nozzles 63 of the first nozzle group 70 located at the upper side when the spray unit 60 moves upwards, whereas pure water is sprayed from the nozzles 63 of the second nozzle group 75 located at the lower side when the spray unit 60 moves downwards. Likewise, in a case where the substrate holder 30 moves relatively to the spray unit 60, it is preferable that pure water is sprayed from the nozzles 63 of the second nozzle group 70 located at the lower side when the substrate holder 30 moves upwards, whereas pure water is sprayed from the nozzles 63 of the first nozzle group 70 located at the upper side when the substrate holder 30 moves downwards. In other words, it is preferable to spray pure water from a leading nozzle group located at the head side in the traveling direction of the relative movement of the spray unit 60 out of the first nozzle group 70 and the second nozzle group 75. As a result, spray can be directly applied to the shadowed portion on the plating target surface of the substrate Wf described above while reducing the influence of the water membrane under spraying of each nozzle group.

Figure 6:
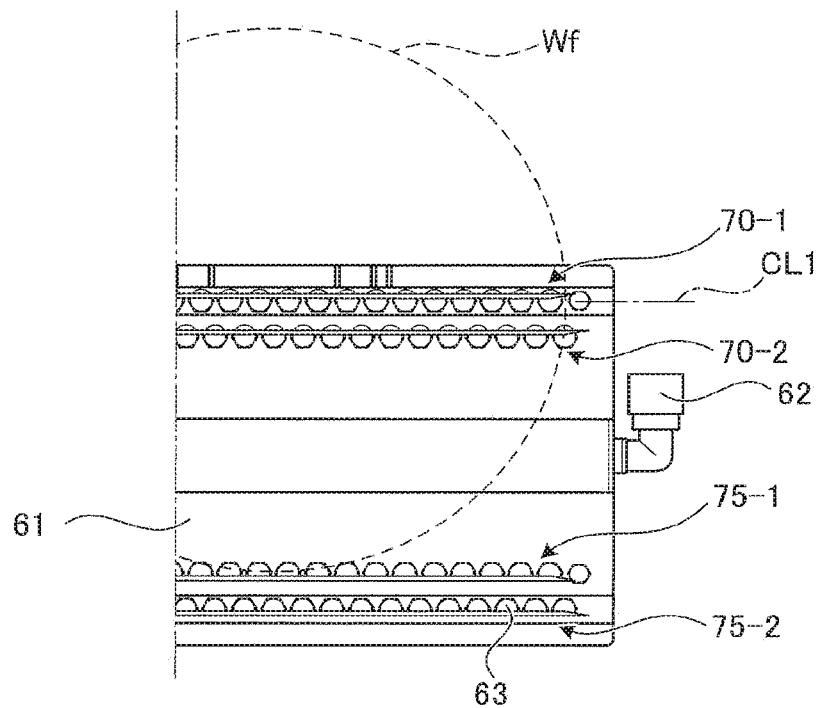
FIG. 6 is a plan view of the spray unit located at the lowermost position.
Figure 7:
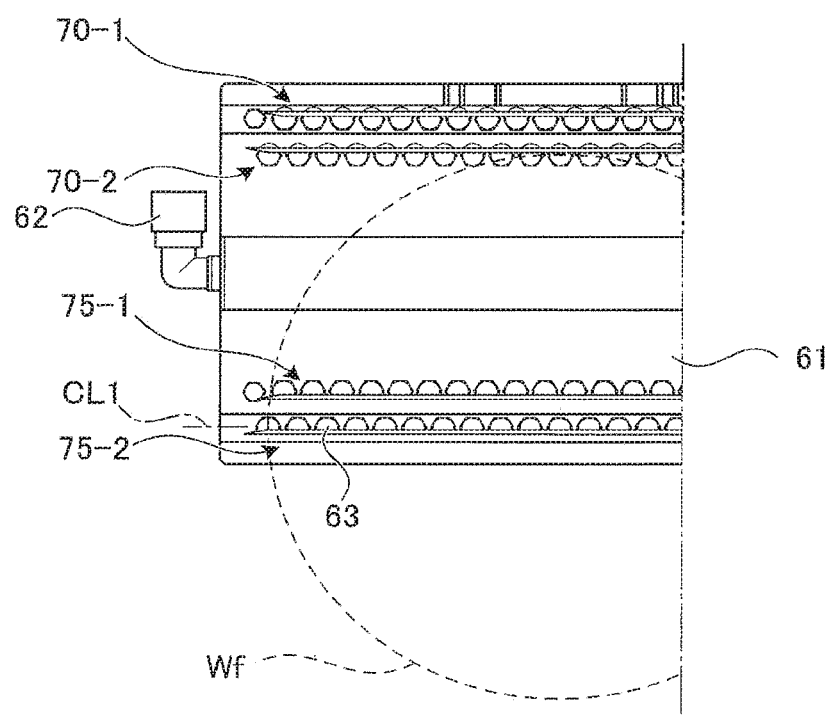
FIG. 7 is a plan view of the spray unit located at the uppermost position.

Next, the stroke of the reciprocating movement in the vertical direction of the spray unit 60 will be described. FIG. 6 is a plan view of the spray unit 60 located at a lowermost portion. FIG. 7 is a plan view of the spray unit 60 located at an uppermost portion. In FIGS. 6 and 7, the substrate Wf is shown for convenience of description. In this embodiment, the stroke of the spray unit 60 is set so that the scanning frequency by the nozzles 63 of the spray unit 60 is identical in an area of the substantially whole face of the surface of the substrate Wf on which the resist opening portions are formed. Specifically, the stroke of the spray unit 60 is set so that sprayings from, for example, two nozzle arrays out of the first nozzle array 70-1 and the second nozzle array 70-2 of the first nozzle group 70 and the first nozzle array 75-1 and the second nozzle array 75-2 of the second nozzle group 75 impinge on to the surface of the substrate Wf.

In this embodiment, as shown in FIG. 6, when the spray unit 60 is located at the lowermost portion, pure water from the nozzles 63 of the first nozzle array 70-1 of the first nozzle group 70 is sprayed to an upper side of a center line CL1 in the up-and-down direction of the substrate Wf. On the other hand, pure water from the nozzles 63 of the second nozzle array 70-2 of the first nozzle group 70 and the first nozzle array 75-1 and the second nozzle array 75-2 of the second nozzle group 75 is sprayed to a lower side of the center line CL1. Furthermore, as shown in FIG. 7, when the spray unit 60 is located at the uppermost portion, pure water from the nozzles 63 of the second nozzle array 75-2 of the second nozzle group 75 is sprayed to a lower side of the center line CL1 in the up-and-down direction of the substrate Wf. On the other hand, pure water from the nozzles 63 of the first nozzle array 70-1 and the second nozzle array 70-2 of the first nozzle group 70, and the first nozzle array 75-1 of the second nozzle group 75 is sprayed to an upper side of the center line CL1. As a result, pure water is sprayed from the second nozzle array 70-2 of the first nozzle group 70 and the first nozzle array 75-1 of the second nozzle group 75 is sprayed onto the center line CL1 of the substrate Wf, for example.

In order to achieve uniformity of the spray amount onto the plating target surface of the substrate Wf, for example, it may be considered that the spray unit 60 having one nozzle array is scanned on the whole area of the plating target surface of the substrate Wf at only the same frequency. However, in this case, the stroke of the spray unit 60 increases, and it takes much time to perform the processing of removing the resist residues. In this embodiment, by reciprocating the spray unit 60 in the vertical direction with a stroke as shown in FIGS. 6 and 7, sprayings from two arrays out of sprayings from the first nozzle array 70-1 and the second nozzle array 70-2 of the first nozzle group 70 and the first nozzle array 75-1 and the second nozzle array 75-2 of the second nozzle group 75 are applied to the substantially whole area of the plating target surface of the substrate Wf. As a result, the spray amount to the plating target surface of the substrate Wf can be made uniform while the stroke of the spray unit 60 is reduced. However, when there is no restriction on the installation space of the plating apparatus and the stroke in the up-and-down direction is allowed to increase or the like, the spray unit 60 may be configured to have only one nozzle array.

Figure 8A:
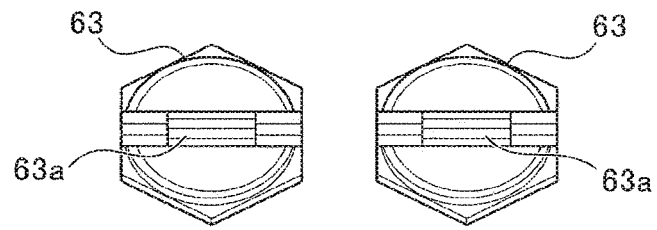
FIG. 8A is a plan view showing a comparative example of the orientation of a nozzle of the spray unit.
Figure 8B:
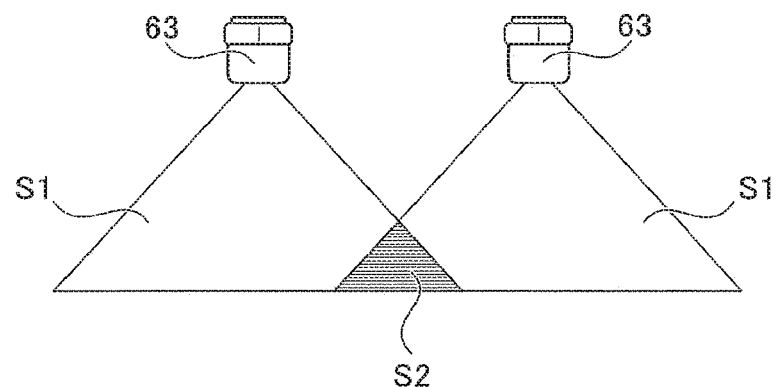
FIG. 8B is a top view showing a comparative example of the orientation of the nozzle of the spray unit.

Next, the orientations of the adjacent nozzles 63 will be described. FIG. 8A is a plan view showing a comparative example of the orientation of the nozzles 63 of the spray unit 60. FIG. 8B is a top view showing a comparative example of the orientation of the nozzles 63 of the spray unit 60. As shown in FIG. 8A, the nozzle ports 63a of the nozzles 63 have a slot shape. In this comparative example, the nozzle ports 63a of the adjacent nozzles 63 are provided so that the longitudinal directions thereof are horizontal. When the adjacent nozzles 63 are arranged to be oriented as shown in FIG. 8A, there occurs a portion S2 where sprayings of pure water S1 sprayed from the nozzles 63 interfere with each other as shown in FIG. 8B, so that the substrate Wf are not appropriately sprayed with pure water at some place.

Figure 9A:
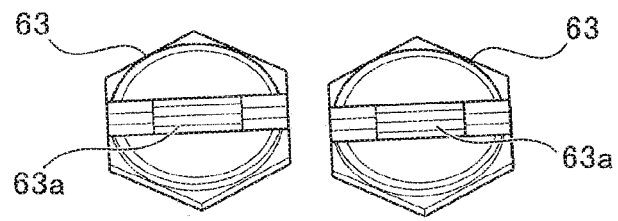
FIG. 9A is a plan view showing an embodiment of the orientation of the nozzle of the spray unit.
Figure 9B:
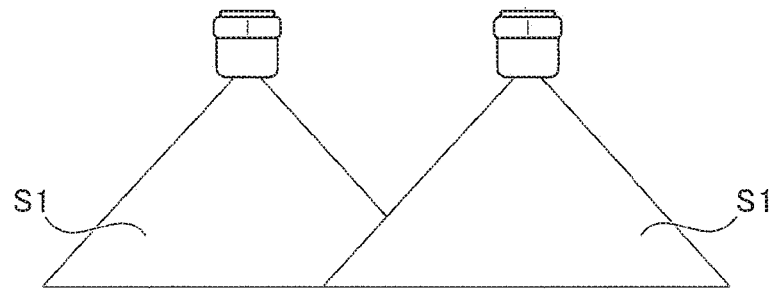
FIG. 9B is a top view showing an embodiment of the orientation of the nozzle of the spray unit.

FIG. 9A is a plan view showing an example of the orientations of the nozzles 63 of the spray unit 60. FIG. 9B is a top view showing the example of the orientation of the nozzles 63 of the spray unit 60. In the example shown in FIG. 9A, the nozzle ports 63a of the adjacent nozzles 63 are inclined so that the longitudinal directions of the nozzle ports 63a have the same angle with respect to the horizontal plane. When the adjacent nozzles 63 are arranged to be oriented as shown in FIG. 9A, sprayings of pure water S1 sprayed from the nozzles 63 are not in contact with each other as shown in FIG. 9B, and thus the interference of the nozzles 63 can be prevented.

Figure 10:
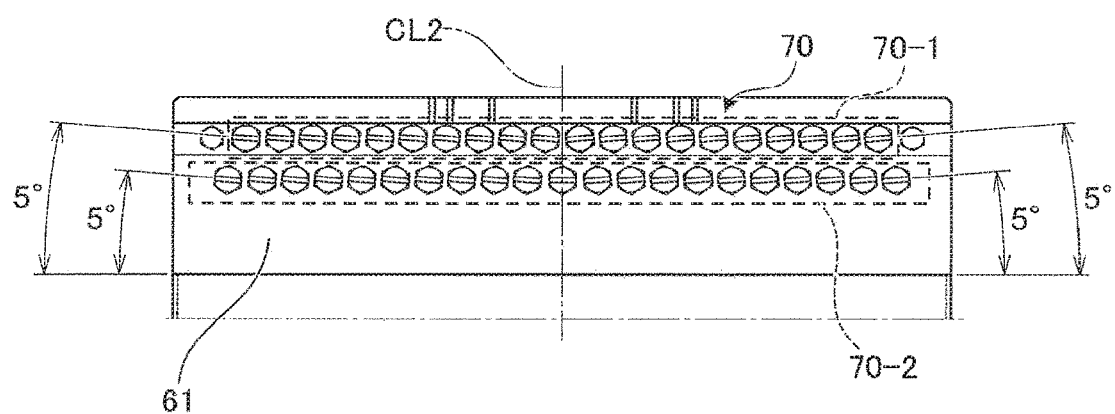
FIG. 10 is a partial plan view showing an example of the array of nozzles of a first nozzle group of the spray unit.

FIG. 10 is a partial plan view showing an example of the array of the nozzles 63 of the first nozzle group 70 of the spray unit 60. In the example shown in FIG. 10, the nozzles 63 at the left side of a center line CL2 in the width direction are downwards inclined to the center line CL2 at a predetermined angle (about 5° C.) so that the center line CL2 sides (right sides in FIG. 10) of the nozzle ports 63a descend. On the other hand, the nozzles 63 at the right side of the center line CL2 in the width direction are downwards inclined to the center line CL2 at a predetermined angle (about 5° C.) so that the center line CL2 sides (left sides in FIG. 10) of the nozzle ports 63a descend. The nozzle 63 located on the center line CL2 of the second nozzle array 70-2 is arranged so that the longitudinal direction of the nozzle port 63a is horizontal. In the example of FIG. 10, the spray from the nozzle 63 located on the center line CL2 of the second nozzle array 70-2 may interfere with the spray from the adjacent nozzles 63.

Figure 11:
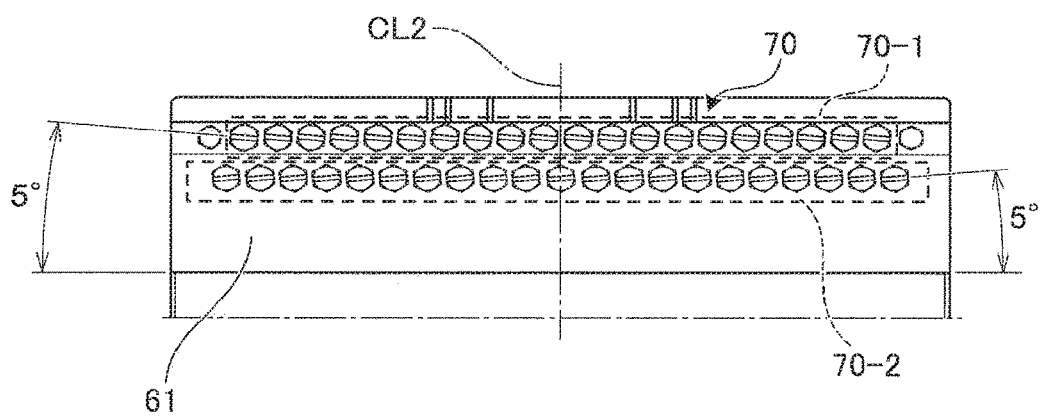
FIG. 11 is a partial plan view showing another example of the array of nozzles of the first nozzle group of the spray unit.

FIG. 11 is a partial plan view showing another example of the array of the nozzles 63 of the first nozzle group 70 of the spray unit 60. In the example shown in FIG. 11, the nozzles 63 of the first nozzle array 70-1 are inclined at a predetermined angle (about 5° C.) so that the right sides of the nozzle ports 63a in FIG. 11 descend. The nozzles 63 of the second nozzle array 70-2 are inclined at a predetermined angle (about 5° C.) so that the left sides of the nozzle ports 63a in FIG. 11 descend. In the example of the FIG. 11, sprayings from all the nozzles 63 of the first nozzle group 70 can be prevented from interfering with the sprayings from the other nozzles.

As shown in FIG. 9A to FIG. 11, when the plural nozzles 63 constituting the first nozzle group 70 and the second nozzle group 75 have the slot-shaped nozzle ports 63a, it is preferable that the nozzle ports 63a of the plural nozzles 63 are oriented so that the sprayings therefrom do not interfere with the sprayings from the horizontally adjacent other nozzles 63. As a result, the uniformity of the spraying to the substrate Wf can be enhanced. Any shape may be adopted as the shape of the nozzle ports 63a. Even when the shape of the nozzle ports 63a is not the slot-shape, it is also preferable to orient the nozzle ports 63a so that the spraying therefrom do not interfere with the spraying from the other nozzles 63.

Figure 12A:
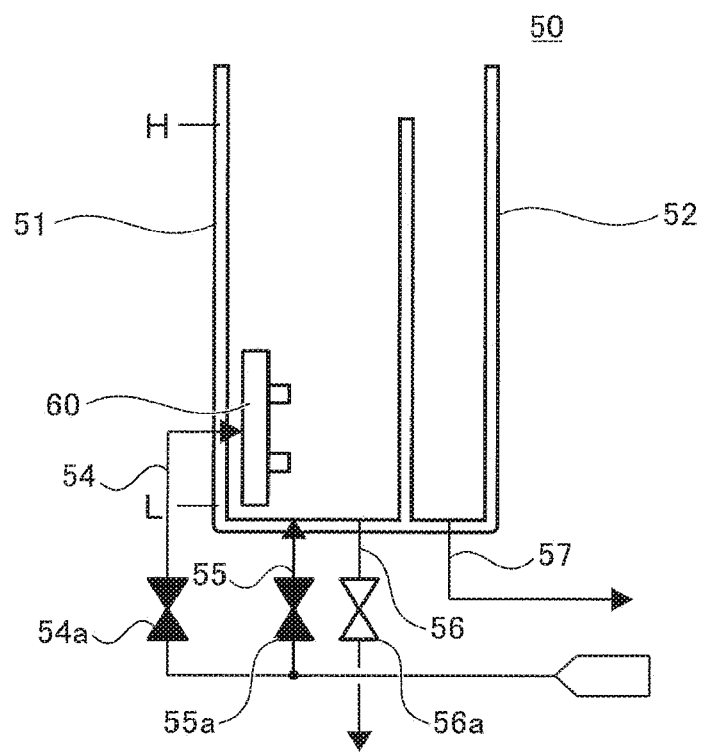
FIG. 12A is a schematic side cross-sectional view of a resist residue removing apparatus to show a procedure for removing a resist residue on a substrate.

Next, the procedure of removing resist residues on the substrate Wf in the resist residue removing apparatus 50 will be described. FIGS. 12A to 12D are schematic side cross-sectional view of the resist residue removing apparatus 50 to describe the procedure of removing resist residues on the substrate Wf. As shown in FIG. 12A, when the substrate holder 30 holding the substrate Wf is not accommodated in the processing bath 51, only the first discharge valve 56a is opened, and the other valves are closed.

Figure 12B:
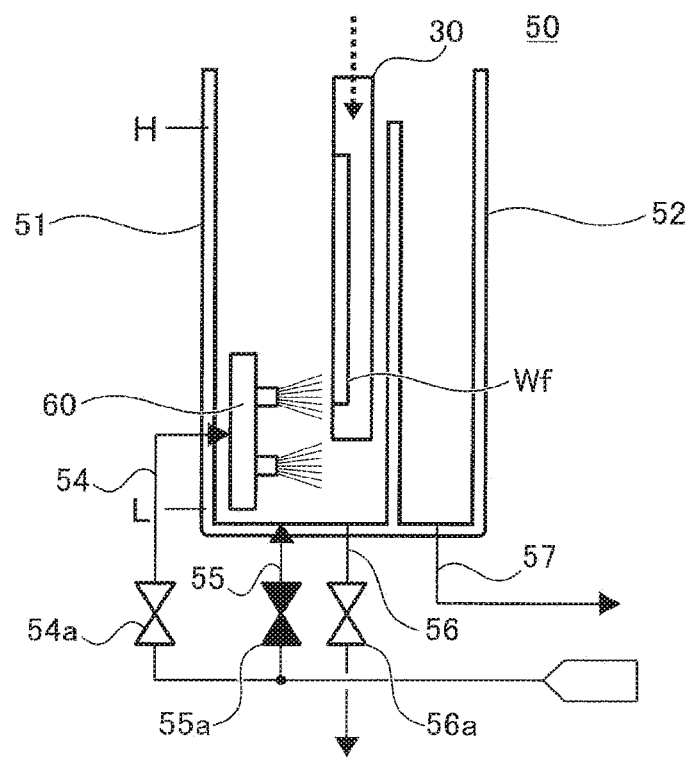
FIG. 12B is schematic side cross-sectional view of the resist residue removing apparatus to show the procedure for removing the resist residue on the substrate.

As shown in FIG. 12B, when the substrate holder 30 is accommodated in the processing bath 51, it is preferable to open the first supply valve 54a and start spraying of pure water from the nozzles 63 of the spray unit 60 in advance. Subsequently, the substrate Wf is vertically accommodated in the processing bath 51 while pure water has been sprayed from the nozzles 63. At this time, since spraying from the spray unit 60 has been already started in advance, pure water is sprayed to the substrate Wf at the same time when the substrate Wf is accommodated in the processing bath 51. Therefore, as compared with a case where spray is started after the substrate Wf has been accommodated in the processing bath 51, the processing time can be shortened.

Figure 12C:
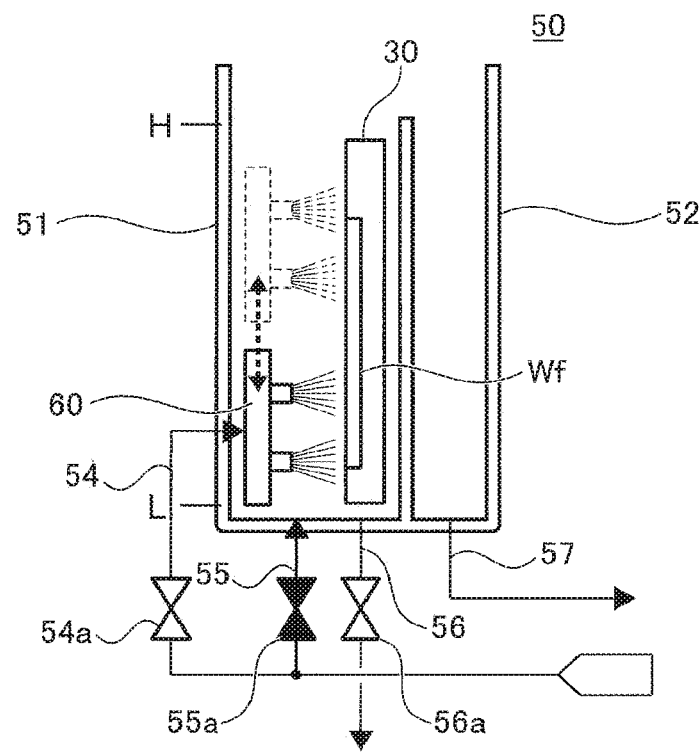
FIG. 12C is schematic side cross-sectional view of the resist residue removing apparatus to show the procedure for removing the resist residue on the substrate.
Figure 12D:
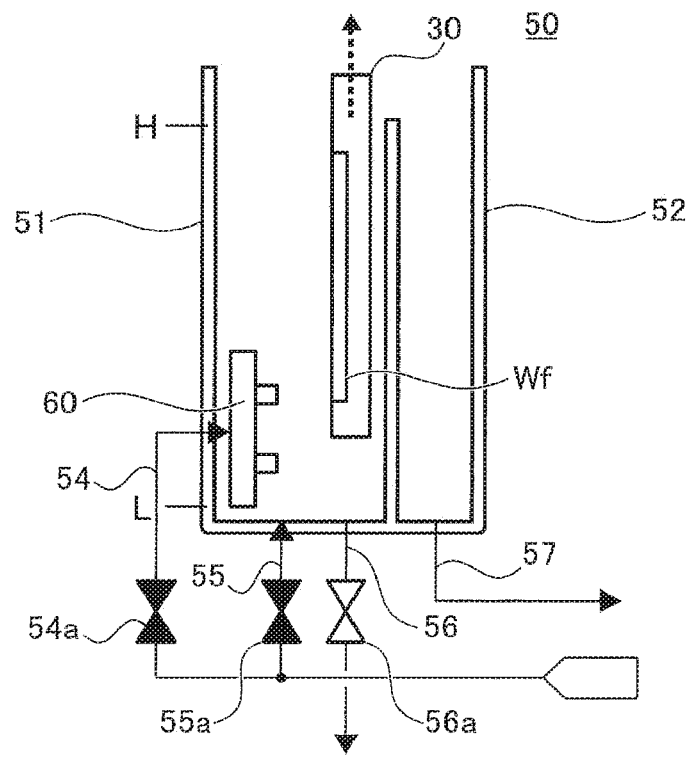
FIG. 12D is schematic side cross-sectional view of the resist residue removing apparatus to show the procedure for removing the resist residue on the substrate.

After the substrate Wf is accommodated in the processing bath 51, the spray unit 60 is reciprocated vertically in the up-and-down direction as shown in FIG. 12C to spray pure water to the front face of the surface on which the resist opening portions of the substrate Wf are formed, thereby removing resist residues in the resist opening portions of the substrate Wf. Pure water which is sprayed from the spray unit 60 and accumulated in the processing bath 51 is discharged from the first discharge pipe 56. After the spraying of pure water from the spray unit 60 is stopped, the substrate Wf is taken out from the processing bath 51 as shown in FIG. 12D. When removal of resist residues is performed on the substrate Wf, the processing shown in FIGS. 12A to 12D may be repeated.

Figure 13:
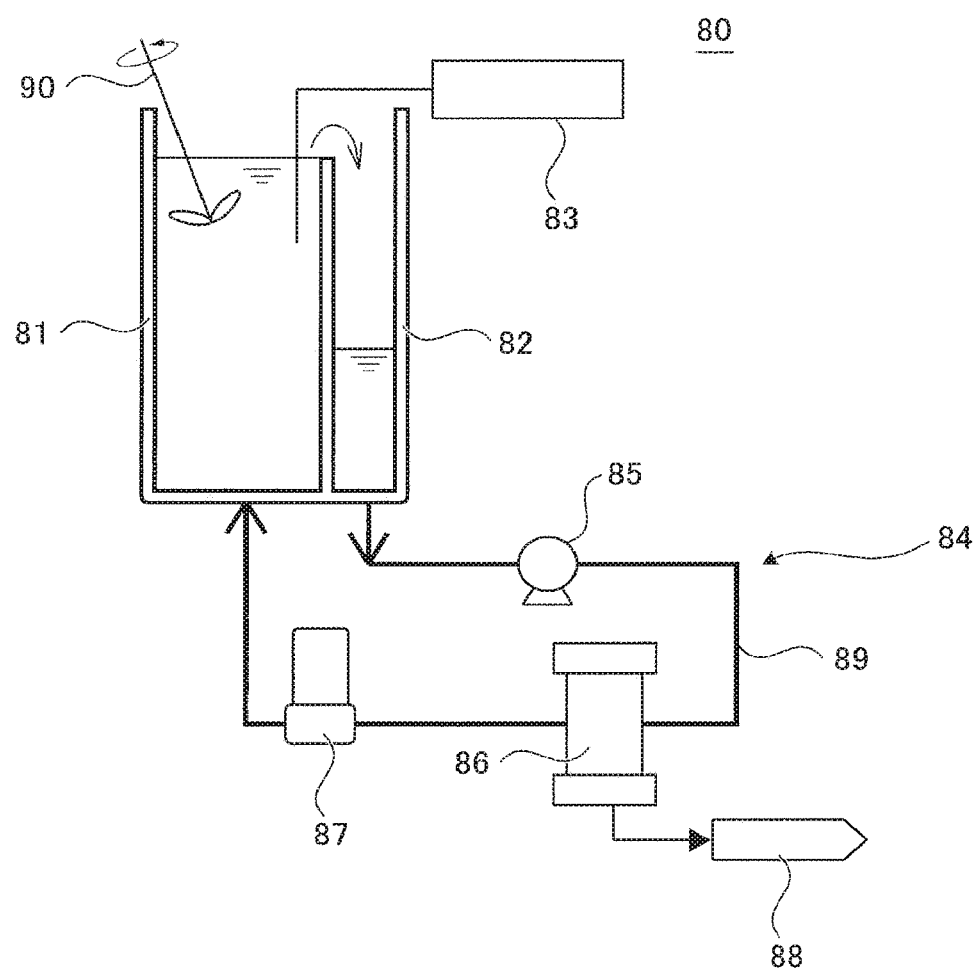
FIG. 13 is a schematic side cross-sectional view of a liquid filling apparatus.

Next, the liquid filling apparatus constituting the pre-wetting bath 40 will be described in detail. FIG. 13 is a schematic side cross-sectional view of the liquid filling apparatus. The liquid filling apparatus 80 is configured to fill the resist opening portions of the substrate with the second process liquid Wf which has been processed in the resist residue removing apparatus 50. For example, Liquid different from the first process liquid treated in the resist residue removing apparatus 50 may be adopted as the second process liquid treated in the liquid filling apparatus 80. Specifically, as the second process liquid may be adopted, for example, any one of deaerated water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, any combination thereof, or the like. In this embodiment, an example in which deaerated water is used as the second process liquid will be described.

As shown in FIG. 13, the liquid filling apparatus 80 includes a deaerating bath 81 (corresponding to an example of the second processing bath), an overflow bath 82, a dissolved oxygen meter 83, and a deaerated water circulation device 84 (corresponding to an example of a circulation device). The deaerating bath 81 stocks deaerated water, and is configured to accommodate a substrate holder holding a substrate Wf. The overflow bath 82 is arranged to be adjacent to the deaerating bath 81, and is configured to receive deaerated water overflowing from the deaerating bath 81. The dissolved oxygen meter 83 is configured to measure the dissolved oxygen concentration of deaerated water in the deaerating bath 81. The deaerated water circulation device 84 is configured to circulate the deaerated water in the deaerating bath 81. The liquid filling apparatus 80 may further include a stirring device 90 for stirring the deaerated water in the deaerating bath 81. In addition to the above devices, the liquid filling apparatus 80 may include an in-water nozzle for spraying deaerated water to the substrate Wf in the deaerated water.

The deaerated water circulation device 84 has a circulation pipe line 89 which is in fluid communication with the overflow bath 82 and the deaerating bath 81. The deaerated water circulation device 84 includes a pump 85, a deaerating unit 86 and a filter 87 on the circulation pipe line 89. The pump 85 is configured to transport deaerated water from the overflow bath 82 to the deaerating bath 81. The deaerating unit 86 is connected to a vacuum source 88 to perform deaerating processing on deaerated water in the circulation pipe line 89. The filter 87 removes impurities contained in the deaerated water in the circulation pipe line 89.

When deaerated water is circulated in the liquid filling apparatus 80, the deaerated water circulation device 84 first actuates the pump to supply deaerated water from the lower side of the deaerating bath 81. As a result, deaerated water overflows from the deaerating bath 81, and flows into the overflow bath 82. In other words, the deaerated water is discharged from the upper side of the deaerating bath 81 to the overflow bath 82. Subsequently, the deaerated water flowing into the overflow bath 82 is discharged from the lower side of the overflow bath 82, deaerated in the deaerating unit 86, passed through the filter 87 to remove impurities, and then returned to the deaerating bath 81. As described above, the deaerated water in the deaerating bath 81 is circulated. The deaerated water circulation device 84 also deaerates the deaerated water while the deaerated water is circulated between the overflow bath 82 and the deaerating bath 81, so that the dissolved oxygen concentration of the deaerated water in the deaerating bath 81 can be maintained to a predetermined value or less.

The liquid filling apparatus 80 processes the substrate Wf from which resist residues in the resist opening portions have been removed by the resist residue removing apparatus 50. Specifically, the liquid filling apparatus 80 can remove bubbles in the resist opening portions of the substrate Wf by soaking the substrate holder 30 holding the substrate Wf from the resist residues have been removed, in the deaerated water inside the deaerating bath 81.

Figure 14A:
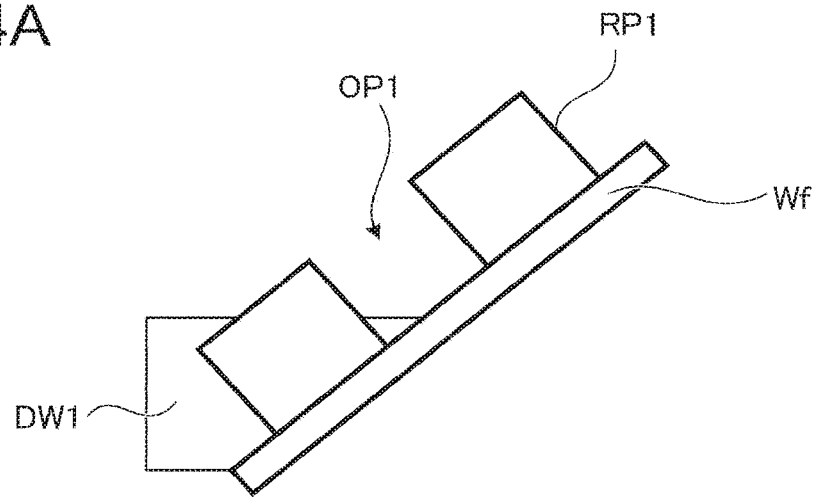
FIG. 14A is a schematic side cross-sectional view of a substrate to show the state of the inside of a resist opening portion when the substrate is soaked in deaerated water.
Figure 14B:
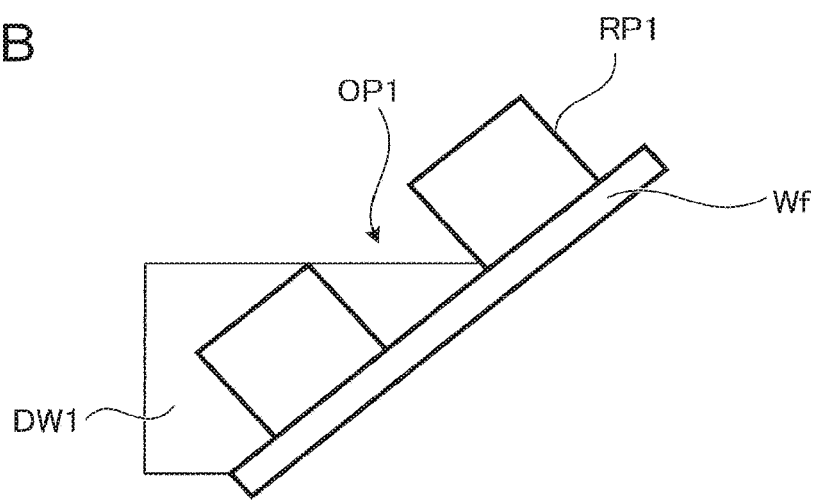
FIG. 14B is a schematic side cross-sectional view of the substrate to show the state of the inside of the resist opening portion when the substrate is soaked in deaerated water.
Figure 14C:
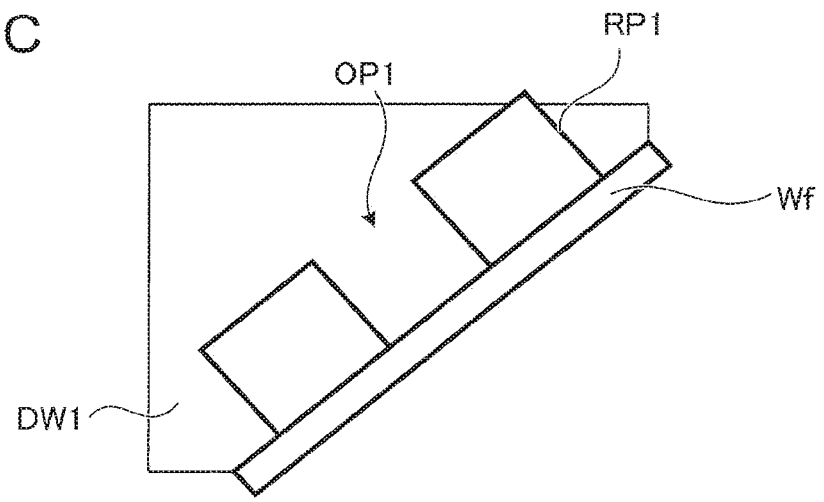
FIG. 14C is a schematic side cross-sectional view of the substrate to show the state of the inside of the resist opening portion when the substrate is soaked in deaerated water.

Although the substrate Wf may be soaked in the deaerated water in the vertical direction, it is preferable that the substrate Wf is arranged in the deaerating bath so that the surface having the resist opening portions formed thereon is placed face up and the substrate Wf is inclined. FIGS. 14A to 14C are schematic side cross-sectional views of the substrate Wf which show the state of the resist opening portion when the substrate Wf is soaked in the deaerated water. As shown in FIG. 14A, a resist pattern RP1 is formed on the upper surface of the substrate Wf to form a resist opening portion OP1. The surface of the substrate Wf on which the resist opening portion OP1 is formed is placed face up, and the substrate Wf is inclined.

When the substrate Wf is gradually soaked in the deaerated water DW1 under the state that the substrate Wf is inclined as shown in FIG. 14A, the deaerated water DW1 fills the resist opening portion OP1 while absorbing gas or bubbles in the resist opening portion OP1 (see FIGS. 14B and 14C). The surface of the substrate Wf on which the resist opening portion OP1 is formed is placed face up, and the substrate Wf is inclined, which makes it easy to fill the resist opening portion OP1 with the deaerated water.

When the substrate Wf is soaked in the deaerated water DW1, impact or vibration may be applied to the substrate Wf by a driving device (not shown). The impact or vibration makes it easy to separate a bubble in the resist opening portion OP1 from the substrate Wf, so that deaerated water DW1 easily fills the resist opening portion OP1. Furthermore, when the resist residue removing apparatus 50 includes the stirring device 90 as shown in FIG. 13, the flow rate of the deaerated water DW1 which is in contact with the surface of the substrate Wf is increased by stirring the deaerated water DW1 in the neighborhood of the surface of the substrate Wf, so that the filling efficiency of liquid into the resist opening portion OP1 can be enhanced. Furthermore, as shown in FIG. 13, the deaerated water circulation device 84 circulates the deaerated water in the deaerating bath 81, thereby increasing the flow rate of the deaerated water DW1 in contact with the surface of the substrate Wf, so that the filling efficiency of the liquid in the resist opening portion OP1 can be enhanced. Furthermore, when the liquid filling apparatus 80 includes an in-water nozzle for spraying the deaerated water DW1 to the substrate Wf, the flow rate of the deaerated water DW1 in contact with the surface of the substrate Wf is increased by spraying the deaerated water DW1 to the substrate Wf in water, so that the filling efficiency of the liquid into the resist opening portion OP1 can be enhanced.

As described above, the plating apparatus according to this embodiment includes the pre-wetting bath 40 having the resist residue removing apparatus 50 and the liquid filling apparatus 80. Therefore, even when a substrate Wf has a remaining resist residue in the resist opening portion OP1, the resist opening portion OP1 can be filled with the liquid after the resist residue is removed, and further occurrence of a plating failure caused by bubbles and resist residues can be suppressed.

Figure 15:
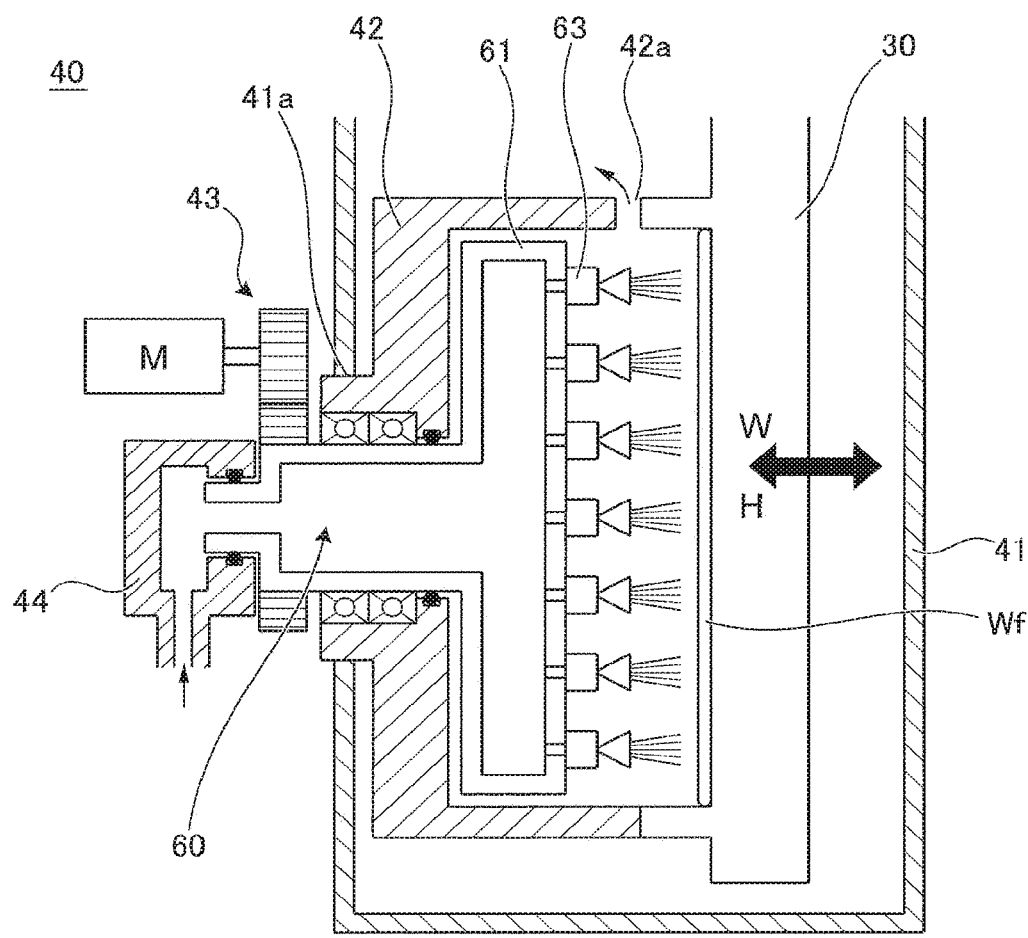
FIG. 15 is a schematic side cross-sectional view showing a pre-wetting bath according to another embodiment.

In the embodiment described above, the resist residue removing apparatus 50 and the liquid filling apparatus 80 are described to be configured as separate apparatuses. However, these apparatuses may be configured to be integrated into one body. FIG. 15 is a schematic side cross-sectional view showing the pre-wetting bath 40 according to another embodiment. The pre-wetting bath 40 contains both of the resist residue removing apparatus and the liquid filling apparatus. As shown in FIG. 15, the pre-wetting bath 40 includes a processing bath 41, a spray cover 42, a spray unit 60, a rotating mechanism 43 and a rotary joint 44.

The processing bath 41 is configured to accommodate the substrate holder 30 holding the substrate Wf. The processing bath 41 has an opening 41a at a side portion thereof. A substantially cup-shaped spray cover 42 is air-tightly fitted to the opening 41a. A cut-out 42a is provided on the upper side of the end portion of the spray cover 42 which confronts the substrate holder 30. A part of the spray unit 60 is located outside the processing bath 41 via the opening 41a. The gap between the spray unit 60 and the spray cover 42 is sealed by a mechanism seal or the like to prevent pure water or deaerated water in the spray cover 42 from leaking to the outside of the processing bath 41.

The main body portion 61 of the spray unit 60 is formed to be substantially disc-shaped, and located inside the spray cover 42. Plural nozzles 63 are provided to a surface of the main body portion 61 which confronts the substrate Wf. The nozzles 63 are arranged to spray pure water over the whole length of the diameter of the substrate Wf.

The rotating mechanism 43 has, for example, a motor and a gear, and is engaged with a part of the spray unit 60 located outside the processing bath 41 to rotate the main body portion 61 of the spray unit 60 along the circumferential direction of the substrate Wf. The spray unit 60 is connected to a liquid supply source (not shown) via the rotary joint 44. The liquid supply source supplies pure water or deaerated water to the spray unit 60.

When the resist residues of the resist opening portions are removed in the pre-wetting bath 40, the substrate holder 30 is accommodated in the processing bath 41. At this time, the substrate holder 30 is arranged to be spaced from the end portion of the spray cover 42 at a predetermined distance. Pure water is supplied from the liquid supply source (not shown) to the spray unit 60, and pure water is sprayed from the nozzles 63 to the surface of the substrate Wf on which the resist opening portions are formed. The rotating mechanism 43 rotates the spray unit 60 along the circumferential direction of the substrate Wf, whereby pure water from the spray unit 60 is enabled to impinge against the whole face of the surface of the substrate Wf on which the resist opening portions are formed, and further enables the resist residues in the resist opening portions to be removed over the whole face of the substrate Wf. The pure water sprayed to the substrate Wf is accumulated in the processing bath 41, and discharged to the outside of the processing bath 41 by a discharge unit (not shown).

After the removal of the resist residues in the resist opening portions is finished, the liquid filling processing is performed. First, the substrate holder 30 is approached to the spray cover 42 to bring the end portion of the spray cover 42 into contact with the substrate holder 30 as shown in FIG. 15. As a result, a closed space is formed by the spray cover 42 and the substrate holder 30. Under this state, deaerated water is supplied from the liquid supply source (not shown) to the spray unit 60, and the deaerated water is sprayed from the nozzles 63 to the surface of the substrate Wf on which the resist opening portions are formed. The deaerated water sprayed to the substrate Wf is accumulated in the closed space formed by the spray cover 42 and the substrate holder 30. The spraying is continued and then the closed space is fully filled with the deaerated water. As a result, the deaerated water comes into contact with the front face of the surface of the substrate Wf on which the resist opening portions are formed, and the resist opening portions is filled with the deaerated water. By continuing supply of the deaerated water from the spray unit 60, the deaerated water accumulated in the closed space overflows from the cut-out 42a and flows into the processing bath 41. The deaerated water flowing into the processing bath 41 is discharged to the outside of the processing bath 41 by the discharge unit (not shown).

As shown in FIG. 15, the pre-wetting bath 40 in this embodiment is capable of performing resist residue removing processing and liquid filling processing in the single processing bath 41. Therefore, as compared with a case where the resist residue removing apparatus 50 and the liquid filling apparatus 80 are provided to different baths, the foot-print of the pre-wetting bath 40 can be reduced.

The embodiments of the present invention have been described above. However, the foregoing embodiments of the present invention are introduced to make the understanding of the present invention easy, and does not limit the present invention. It is needless to say that the present invention may be modified or improved without departing from the subject matter thereof, and contains equivalents thereof. Furthermore, it is possible to perform any combination or omission of respective constituent elements described in claims and the specification within a range where at least a part of the foregoing problem can be solved, or within a range where at least a part of the effect can be achieved. For example, in the foregoing description, the electroplating apparatus is used as an example of the plating apparatus. However, the present invention is not limited to the electroplating apparatus, but may be also applied to an electroless plating apparatus for performing pre-wetting treatment.

Some aspects disclosed in the specification will be described hereunder.

According to a first aspect, a plating method for plating a substrate having resist opening portions is provided. This plating method includes a resist residue removing step of removing resist residues in the resist opening portions of the substrate by spraying first process liquid to a surface of the substrate on which the resist opening portions are formed, a liquid filling step of soaking the substrate passed through the removing step in second process liquid to fill the resist opening portions of the substrate with the second process liquid, and a plating step of plating the substrate passed through the liquid filling step.

According to the first aspect, for even a substrate having resist residue existing in a resist opening portion, the resist opening portions can be filled with liquid after the resist residues are removed. Accordingly, occurrence of a plating failure caused by a bubble or a resist residue can be suppressed.

According to a second aspect, in the plating method of the first aspect, the resist residue removing step has a step of spraying the first process liquid to the whole face of the surface of the substrate on which the resist opening portions are formed.

According to the second aspect, since the first process liquid is sprayed to the whole face of the surface of the substrate on which resist opening portions are formed, resist residues in all the resist opening portions formed on the substrate can be removed. Here, "the whole face of the surface of the substrate on which the resist opening portions are formed" means the whole face of a surface of the substrate which is exposed from a substrate holder when the substrate is held by the substrate holder.

According to a third aspect, in the plating method of the second aspect, the resist residue removing step includes a step of scanning the substrate by nozzles. According to the third aspect, the first process liquid can be sprayed onto the whole face of the substrate by a small number of nozzles.

According to a fourth aspect, in the plating method of the third aspect, the nozzles include a first nozzle group and a second nozzle group which are spaced from each other in upper and lower positions in a vertical direction, and the resist residue removing step includes a step of performing spraying from the first nozzle group and spraying from the second nozzle group to the substrate arranged in a vertical direction at different timings.

According to the fourth aspect, since the first nozzle group and the second nozzle group which are spaced from each other in upper and lower positions are provided, a stroke for scanning the nozzles along the surface of the substrate can be reduced, and the size of the apparatus can be reduced. Furthermore, the spraying from the first nozzle group and the spraying from the second nozzle group are performed at different timings, so that an effect of a water membrane under spraying from each nozzle group can be reduced.

According to a fifth aspect, in the plating method of the fourth aspect, the resist residue removing step includes a step of spraying the first process liquid to the substrate from a leading nozzle group in the travel direction of the nozzles, the leading nozzle group being one of the first nozzle group and the second nozzle group.

According to a sixth aspect, in the plating method of the fifth aspect, the first nozzle group is located above the second nozzle group in a vertical direction, and the resist residue removing step includes a step of spraying while nozzle ports of the nozzles constituting the first nozzle group are inclined upwards with respect to a direction perpendicular to the surface of the substrate on which the resist opening portions are formed, and a step of spraying while nozzle ports of the nozzles constituting the second nozzle group are inclined downwards with respect to the direction perpendicular to the surface of the substrate on which the resist opening portions are formed. According to the sixth aspect, spray can be directly applied to a shadowed portion on a plating target surface of the substrate while reducing an effect of a water membrane under spraying from each nozzle group.

According to a seventh aspect, in the plating method of any one of the second to sixth aspects, the resist residue removing step includes a step of moving the substrate relatively to the nozzles. According to the seventh aspect, the first process liquid can be sprayed to the whole face of the substrate with a small number of nozzles. When the nozzles are scanned above the substrate, the strokes of the scan of the nozzles and the movement of the substrate can be reduced.

According to an eighth aspect, in the plating method according to any one of the first to seventh aspects, the resist residue removing step includes a step of spraying while the nozzle ports of the nozzles are inclined with respect to a direction perpendicular to the surface of the substrate on which the resist opening portions are formed.

When the substrate is held by the substrate holder, a shadowed portion may be formed on a plating target surface of the substrate by the substrate holder. According to the eighth aspect, since the nozzle ports are inclined with respect to the direction perpendicular to the plating target surface of the substrate, spray can be directly applied to even such a shadowed portion on the plating target surface of the substrate. Furthermore, the resist residues in the resist opening portions can be removed over the whole face of the substrate.

According to a ninth aspect, in the plating method according to any one of the first to eighth aspects, the resist residue removing step includes a step of arranging the substrate vertically. According to the ninth aspect, the first process liquid sprayed onto the substrate flows downwards due to gravitational force. Therefore, the amount of the first process liquid which is stagnant on the surface of the substrate can be reduced, so that the resist residue removing efficiency can be suppressed from decreasing due to the first process liquid (water membrane) stagnant on the surface of the substrate.

According to a tenth aspect, in the plating method of the ninth aspect, the resist residue removing step includes a step of spraying the first process liquid from the nozzles arranged in the first processing bath, and a step of accommodating the substrate vertically in the first processing bath under the state that spraying is performed from the nozzles. According to the tenth aspect, since the spraying from the nozzles is started in advance before the substrate is accommodated in the processing bath, the substrate is sprayed with the first process liquid at the same time when the substrate is accommodated in the processing bath. Therefore, the processing time can be shortened as compared with a case where spraying is started after the substrate has been accommodated in the processing bath.

According to an eleventh aspect, in the plating method according to any one of the first to tenth aspects, the resist residue removing step has a step of spraying the first process liquid under a pressure ranging from not less than 0.05 MPa to not more than 0.45 MPa. According to the ninth aspect, the resist residues in the resist opening portions can be more surely removed.

According to a twelfth aspect, in the plating method according to any one of the first to eleventh aspects, the resist residue removing step includes a step of spraying the first process liquid at a flow speed ranging from not less than 2.5 msec to not more than 15.0 msec and at a flow rate ranging from not less than 10 L/min to not more than 20 L/min. According to the twelfth aspect, by setting the flow speed of the first process liquid within the foregoing range, the amount of bubbles caught in the resist opening portions can be reduced, and the processing time in the liquid filling step can be shortened. Furthermore, by setting the flow rate of the first process liquid within the foregoing range, the resist residues can be efficiently removed. Accordingly, by setting the flow speed and flow rate of the first process liquid within the foregoing ranges, both the processing time in the resist residue removing step and the processing time in the liquid filling step can be shortened.

According to a thirteenth aspect, in the plating method according to any one of the first to twelfth aspects, the liquid filling step includes a step of stirring the second process liquid. According to the thirteenth aspect, the flow rate of the second process liquid which comes in contact with the surface of the substrate increases by stirring the second process liquid, so that the filling efficiency of the liquid into the resist opening portions can be enhanced.

According to a fourteenth aspect, in the plating method according to any one of the first to thirteenth aspects, the liquid filling step includes a step of applying impact or vibration to the substrate. According to the fourteenth aspect, bubbles in the resist opening portions are easily separated from the substrate, and thus the resist opening portions are easily filled with the second process liquid.

According to a fifteenth aspect, in the plating method according to any one of the first to fourteenth aspects, the liquid filling step includes a step of supplying the second process liquid from the lower side of the second processing bath in which the substrate is accommodated, a step of discharging the second process liquid from the upper side of the second processing bath, and a step of circulating the second process liquid in the second processing bath. According to the fifteenth aspect, by circulating the second process liquid in the second processing bath, the flow rate of the second process liquid which comes in contact with the surface of the substrate increases, so that the filling efficiency of the liquid into the resist opening portions can be enhanced.

According to a sixteenth aspect, in the plating method according to any one of the first to fifteenth aspects, the liquid filling step includes a step of arranging the substrate in the second processing bath so that the surface of the substrate on which the resist opening portions are formed faces upwards and the substrate is inclined. According to the sixteenth aspect, the resist opening portions are easily filled with deaerated water.

According to a seventeenth aspect, in the plating method according to any one of the first to sixteenth aspects, the first process liquid is liquid different from the second process liquid.

According to an eighteenth aspect, in the plating method according to any one of the first to seventeenth aspects, the first process liquid includes any one of pure water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, and any combination thereof.

According to a nineteenth aspect, in the plating method according to any one of the first to eighteenth aspects, the second process liquid includes any one of deaerated water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, and any combination thereof.

According to a twentieth aspect, a plating apparatus for plating a substrate having resist opening portions is provided. The plating apparatus includes a resist residue removing apparatus for removing resist residues in resist opening portions of the substrate, comprising a spray unit having nozzles for spraying first process liquid to a surface of the substrate on which the resist opening portions are formed, a liquid filling apparatus for soaking the substrate in second process liquid to fill the resist opening portions of the substrate with the second process liquid, and a plating bath for plating the substrate.

According to the twentieth aspect, for even a substrate having resist residues existing in the resist opening portion, the resist opening portions can be filled with liquid after the resist residues are removed. Accordingly, occurrence of a plating failure caused by bubbles or resist residues can be suppressed.

According to a twenty-first aspect, the plating apparatus according to the twentieth aspect further includes a moving mechanism for moving at least one of the spray unit and the substrate so that the spray unit moves relatively along the surface of the substrate. According to the twenty-first aspect, pure water can be sprayed to the whole face of the substrate by a small number of nozzles. Furthermore, when both the spray unit and the substrate are moved, the strokes of the scan of the nozzle and the movement of the substrate can be reduced.

According to a twenty-second aspect, in the plating apparatus according to the twenty-first aspect, the spray unit includes a first nozzle group and a second nozzle group which are spaced from each other in upper and lower positions in a vertical direction, and the first nozzle group and the second nozzle group contain plural nozzles arranged in a horizontal direction.

According to the twenty-second aspect, since the spray unit includes the first nozzle group and the second nozzle group which are spaced from each other in upper and lower positions, the spray unit reciprocates in the up-and-down direction along the surface of the substrate, whereby first process liquid can be sprayed to the whole face of the substrate. Furthermore, a stroke for scanning the nozzles along the surface of the substrate can be reduced, and the size of the apparatus can be reduced.

According to a twenty-third aspect, in the plating apparatus according to the twenty-second aspect, each of the first nozzle group and the second nozzle group includes a first nozzle array and a second nozzle array arranged in the horizontal direction, and the first nozzle array and the second nozzle array are arranged to be adjacent to each other in upper and lower positions. According to the twenty-third aspect, since each of the first nozzle group and the second nozzle group includes two nozzle arrays, there can be avoided a situation in which the first process liquid is not sprayed to the substrate even when a trouble occurs in the nozzles of any one array, and the reliability of the spray unit can be enhanced.

According to a twenty-fourth aspect, in the plating apparatus of the twenty-second aspect or the twenty-third aspect, the plural nozzles constituting the first nozzle group and the second nozzle group have slot-shaped nozzle ports, and at least one nozzle port of the plural nozzles is oriented so as not to interfere with sprayings from other nozzles adjacent in a horizontal direction. According to the twenty-fourth aspect, the sprayings from the adjacent nozzles do not interfere with each other, so that uniformity of the sprayings to the substrate can be enhanced.

According to a twenty-fifth aspect, in the plating apparatus according to any one of the twenty-second aspect to the twenty-fourth aspect, the spray unit is configured so that spraying from the first nozzle group and spraying from the second nozzle group are performed on the substrate arranged in the vertical direction at different timings. According to the twenty-fifth aspect, since spraying from the first nozzle group and spraying from the second nozzle group are performed at different timings, an effect of a water membrane under spraying of each nozzle group can be reduced.

According to a twenty-sixth aspect, in the plating apparatus according to the twenty-fifth aspect, the spray unit is configured so that the first process liquid is sprayed to the substrate from a leading nozzle group in a travel direction of the spray unit, the leading nozzle group being one of the first nozzle group and the second nozzle group.

According to a twenty-seventh aspect, in the plating apparatus according to the twenty-sixth aspect, the first nozzle group is located above the second nozzle group in a vertical direction, nozzles constituting the first nozzle group are provided to the spray unit so that nozzle ports of the nozzles are inclined upwards with respect to a direction perpendicular to a surface of the substrate on which the resist opening portions are formed, and nozzles constituting the second nozzle group are provided to the spray unit so that nozzle ports of the nozzles are inclined downwards with respect to the direction perpendicular to the surface of the substrate on which the resist opening portions are formed. According to the twenty-seventh aspect, spray can be directly applied to a shadowed portion on a plating target surface of the substrate while reducing an effect of a water membrane under spraying of each nozzle group.

According to a twenty-eighth aspect, in the plating apparatus according to any one of the twentieth to twenty-seventh aspects, the nozzles are provided to the spray unit so that the nozzle ports of the nozzles are inclined with respect to a direction perpendicular to the surface of the substrate on which the resist opening portions are formed.

When the substrate is held by a substrate holder, a shadowed portion may be formed on a plating target surface of the substrate by the substrate holder. According to the twentieth aspect, since the nozzle ports are inclined with respect to the direction perpendicular to the plating target surface of substrate, spray can be directly applied to even such a shadowed portion on the plating target surface of the substrate. Furthermore, resist residues in the resist opening portions can be removed on the whole face of the substrate.

According to a twenty-ninth aspect, in the plating apparatus according to any one of the twentieth to twenty-eighth aspects, the resist residue removing apparatus has a first processing bath in which the substrate is accommodated in a vertical direction. According to the twenty-ninth aspect, since the substrate is accommodated in the vertical direction, first process liquid sprayed to the substrate flows downwards by gravitational force. Therefore, the amount of the first process liquid stagnant on the surface of the substrate can be reduced, so that the resist residue removing efficiency can be suppressed from decreasing due to the first process liquid (water membrane) stagnant on the surface of the substrate.

According to a thirtieth aspect, in the plating apparatus according to any one of the twentieth to twenty-ninth aspects, the liquid filling apparatus has a stirring device for stirring the second process liquid. According to the thirtieth aspect, by stirring the second process liquid, the flow rate of the second process liquid which is in contact with the surface of the substrate increases, so that the filling efficiency of the second process liquid into the resist opening portions can be enhanced.

According to a thirty-first aspect, in the plating apparatus of any one of the twentieth to thirtieth aspect, the liquid filling apparatus includes a second processing bath for accommodating the substrate therein, and a circulation device for circulating the second process liquid in the second processing bath. According to the thirty-first aspect, by circulating the second process liquid in the second processing bath, the flow rate of the second process liquid which is in contact with the surface of the substrate increases, so that the filling efficiency of the second process liquid into the resist opening portions can be enhanced.

According to a thirty-second aspect, in the plating apparatus according to any one of the twentieth to thirty-first aspect, the first process liquid is liquid different from the second process liquid.

According to a thirty-third aspect, in the plating apparatus according to any one of the twentieth to thirty-second aspects, the first process liquid includes any one of pure water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, and any combination thereof.

According to a thirty-fourth aspect, in the plating apparatus according to any one of the twentieth to thirty-third aspects, the second process liquid includes any one of deaerated water, pure water containing either surfactant or citric acid, sulfuric acid, sulfuric acid containing either surfactant or citric acid, ionic water containing $CO_2$ ion or the like, liquid containing a compound from a polyalkylene glycol group, liquid containing a compound from an alkylene glycol group containing an amino group, methanesulfonic acid, and any combination thereof.

REFERENCE SIGNS LIST 30 substrate holder
40 pre-wetting bath 41 processing bath
50 resist residue removing apparatus
51 processing bath
60 spray unit
63 nozzle
70 first nozzle group
70-1 first nozzle array
70-2 second nozzle array
75 second nozzle group
75-1 first nozzle array
75-2 second nozzle array
80 liquid filling apparatus
81 deaerating bath
84 deaerated water circulation device
90 stirring device

What is claimed is:

1. A plating apparatus for plating a substrate having resist opening portions including:
a resist residue removing apparatus for removing resist residues in resist opening portions of the substrate, comprising a spray unit having nozzles for spraying a first process liquid to a surface of the substrate on which the resist opening portions are formed;
a liquid filling apparatus for soaking the substrate in a second process liquid to fill the resist opening portions of the substrate with the second process liquid;
a plating bath for plating the substrate;
a controller configured to control the resist residue removing apparatus; and
a moving mechanism for moving at least either one of the spray unit and the substrate so that the spray unit moves relatively along the surface of the substrate,
wherein the spray unit includes a first nozzle group and a second nozzle group that are spaced from each other in upper and lower positions in a vertical direction, and the first nozzle group and the second nozzle group contain a plurality of nozzles arranged in a horizontal direction, and
the controller is configured to control the spray unit so that spraying from the first nozzle group and spraying from the second nozzle group are performed on the substrate arranged in the vertical direction at different timings.

2. The plating apparatus according to claim 1, wherein the first nozzle group includes a first nozzle array arranged in a horizontal direction, the second nozzle group includes a second nozzle array arranged in the horizontal direction, and the first nozzle array and the second nozzle array are arranged to be adjacent to each other in upper and lower positions.

3. The plating apparatus according to claim 2, wherein the plurality of nozzles constituting the first nozzle group and the second nozzle group have slot-shaped nozzle ports, and at least one nozzle port of the plurality of nozzles is oriented so as not to interfere with sprayings from other nozzles adjacent in a horizontal direction.

4. The plating apparatus according to claim 1, wherein the spray unit is configured so that the first process liquid is sprayed to the substrate from a leading nozzle group in a travel direction of the spray unit, the leading nozzle group being one of the first nozzle group and the second nozzle group.

5. The plating apparatus according to claim 4, wherein the first nozzle group is located above the second nozzle group in a vertical direction, nozzles constituting the first nozzle group are provided to the spray unit so that nozzle ports of the nozzles are inclined upwards with respect to a direction perpendicular to a surface of the substrate on which the resist opening portions are formed, and nozzles constituting the second nozzle group are provided to the spray unit so that nozzle ports of the nozzles are inclined downwards with respect to the direction perpendicular to the surface of the substrate on which the resist opening portions are formed.

6. The plating apparatus according to claim 1, wherein the nozzles are provided to the spray unit so that nozzle ports of the nozzles are inclined with respect to a direction perpendicular to the surface of the substrate on which the resist opening portions are formed.

7. The plating apparatus according to claim 1, wherein the resist residue removing apparatus has a first processing bath in which the substrate is accommodated in a vertical direction.

8. The plating apparatus according to claim 1, wherein the liquid filling apparatus includes a stirring device for stirring the second process liquid.

9. The plating apparatus according to claim 1, wherein the liquid filling apparatus includes a processing bath for accommodating the substrate therein, and a circulation device for circulating the second process liquid in the processing bath.

10. The plating apparatus according to claim 1, wherein a first process liquid is liquid different from the second process liquid.

11. The plating apparatus according to claim 1, wherein the first process liquid includes any one of pure water, pure water containing either surfactant or citric acid, sulfuric acid, sulfuric acid containing either surfactant or citric acid, or ionic water containing $CO_2$ ion, liquid containing a compound from a polyalkylene glycol group, liquid containing a compound from an alkylene glycol group containing an amino group, methanesulfonic acid, and any combination thereof.

12. The plating apparatus according to claim 1, wherein the second process liquid includes any one of deaerated water, pure water containing either surfactant or citric acid, sulfuric acid, sulfuric acid containing either surfactant or citric acid, or ionic water containing $CO_2$ ion, liquid containing a compound from a polyalkylene glycol group, liquid containing a compound from an alkylene glycol group containing an amino group, methanesulfonic acid, and any combination thereof.

* * * * *